(12) United States Patent
Kawashima et al.

(10) Patent No.: US 8,198,622 B2
(45) Date of Patent: Jun. 12, 2012

(54) NANOWIRE, DEVICE COMPRISING NANOWIRE, AND THEIR PRODUCTION METHODS

(75) Inventors: Takahiro Kawashima, Osaka (JP); Tohru Saitoh, Osaka (JP)

(73) Assignee: Panasonic Corporation, Osaka (JP)

( * ) Notice: Subject to any disclaimer, the term of this patent is extended or adjusted under 35 U.S.C. 154(b) by 493 days.

(21) Appl. No.: 12/518,821

(22) PCT Filed: Nov. 29, 2007

(86) PCT No.: PCT/JP2007/073034
§ 371 (c)(1),
(2), (4) Date: Jun. 11, 2009

(87) PCT Pub. No.: WO2008/072479
PCT Pub. Date: Jun. 19, 2008

(65) Prior Publication Data
US 2010/0012921 A1    Jan. 21, 2010

(30) Foreign Application Priority Data
Dec. 13, 2006   (JP) ................................ 2006-335345

(51) Int. Cl.
H01L 29/06 (2006.01)
H01L 31/00 (2006.01)
(52) U.S. Cl. ..................... 257/13; 257/E29.07; 977/762
(58) Field of Classification Search .................... 257/13, 257/24, E29.07; 977/938, 762; 438/478
See application file for complete search history.

(56) References Cited

U.S. PATENT DOCUMENTS

| | | | |
|---|---|---|---|
| 6,832,683 B2 | 12/2004 | Boriani et al. | |
| 7,087,920 B1 * | 8/2006 | Kamins | 257/2 |
| 7,718,995 B2 * | 5/2010 | Kawashima et al. | 257/24 |
| 2004/0075464 A1 | 4/2004 | Samuelson et al. | |
| 2006/0182966 A1 | 8/2006 | Lee et al. | |
| 2007/0037365 A1 | 2/2007 | Ranganath et al. | |
| 2007/0228421 A1 | 10/2007 | Shioya et al. | |
| 2011/0171565 A1 * | 7/2011 | Birkan et al. | 429/532 |

FOREIGN PATENT DOCUMENTS

| | | |
|---|---|---|
| JP | 2004-067433 | 3/2004 |
| JP | 2004-532133 | 10/2004 |
| JP | 2004-535066 | 11/2004 |
| JP | 2005-532181 | 10/2005 |
| JP | 2006-140293 | 6/2006 |
| JP | 2006-225258 | 8/2006 |
| JP | 2007-050500 | 3/2007 |
| JP | 2007-070136 | 3/2007 |
| JP | 2007-184566 | 7/2007 |
| JP | 2007-294908 | 11/2007 |
| WO | WO 02/080280 A1 | 10/2002 |
| WO | WO 03/005450 A2 | 1/2003 |

OTHER PUBLICATIONS

Yiying Wu et al., "Block-by-Block Growth of Single-Crystalline Si-SiGe Superlattice Nanowire," Nano Letter, 2002, vol. 2, No. 2, pp. 83-86.

R. Martel, et al., "Single-and multi-wall carbon nanotube field-effect transistors," Appli. Phys. Lett. vol. 73, No. 17, pp. 2447-2449, 1998.

* cited by examiner

*Primary Examiner* — Stephen W Smoot
*Assistant Examiner* — Vicki B Booker
(74) *Attorney, Agent, or Firm* — McDermott Will & Emery LLP

(57) ABSTRACT

A nanowire according to the present invention includes: a nanowire body made of a first material; and a plurality of semiconductor particle made of a second material and being contained in at least a portion of the interior of the nanowire body.

14 Claims, 17 Drawing Sheets

301 MULTI Ge PARTICLE-CONTAINING NANOWIRE
302 REGION WHERE Ge PARTICLES ARE ABSENT
303 REGION WHERE Ge PARTICLES EXIST
304 SiGe NANOWIRE
305 Ge PARTICLE (a)

(b)

1 SEMICONDUCTOR PARTICLE-CONTAINING NANOWIRE
2 CATALYST METAL
3 NANOWIRE BODY
4 SEMICONDUCTOR PARTICLE (a)

(b)

(c)

(d)

5 SUBSTRATE
6 SOURCE GAS

SECTION X

110 Ge PARTICLE-CONTAINING SiGe NANOWIRE
111 SiGe NANOWIRE BODY
112 Ge PARTICLE
113 SILICON OXIDE FILM

Point1   Point2

5nm

110 Ge PARTICLE-CONTAINING SiGe NANOWIRE
111 SiGe NANOWIRE BODY
112 Ge PARTICLE
113 SILICON OXIDE FILM (a)

(b)

114 SILICON SUBSTRATE
115 CATALYST PARTICLE
116 SOURCE GAS (DISILANE GAS, GERMANE GAS)

(a)

(b)

201 NANOWIRE LIGHT-EMISSION DEVICE
202 HETERO NANOWIRE
203 SUBSTRATE
204a FIRST ELECTRODE
204b SECOND ELECTRODE
205 SEMICONDUCTOR PARTICLE-CONTAINING NANOWIRE
206 CONTACT LAYER NANOWIRE

301 MULTI Ge PARTICLE-CONTAINING NANOWIRE
302 REGION WHERE Ge PARTICLES ARE ABSENT
303 REGION WHERE Ge PARTICLES EXIST
304 SiGe NANOWIRE
305 Ge PARTICLE (a)

306 CATALYST PARTICLE
307 SUBSTRATE
308 SOURCE GAS
309 Si NANOWIRE
310 SiGe NANOWIRE (b)

(c)

(d)

311  NANOWIRE LIGHT-EMISSION DEVICE
312  SUBSTRATE
313  FIRST ELECTRODE
314  SECOND ELECTRODE

401 Ge PARTICLE-CONTAINING DOPED HETERO NANOWIRE
402 Ge PARTICLE-CONTAINING NANOWIRE
403 p-Si NANOWIRE
404 n-Si NANOWIRE
405 NANOWIRE PHOTODETECTION DEVICE
406 SUBSTRATE
407 FIRST ELECTRODE
408 SECOND ELECTRODE (a)

(b)

(c)

1001 SEMICONDUCTOR NANOWIRE
1002 CORE-SHELL NANOWIRE
1003 CORE PORTION
1004 SHELL PORTION
1005 HETERO NANOWIRE
1006 FIRST SEMICONDUCTOR NANOWIRE
1007 SECOND SEMICONDUCTOR NANOWIRE

NANOWIRE, DEVICE COMPRISING NANOWIRE, AND THEIR PRODUCTION METHODS

RELATED APPLICATIONS

This application is the U.S. National Phase under 35 U.S.C. §371 of International Application No. PCT/JP2007/073034, filed on Nov. 29, 2007, which in turn claims the benefit of Japanese Application No. 2006-335345, filed on Dec. 13, 2006, the disclosures of which Applications are incorporated by reference herein.

TECHNICAL FIELD

The present invention relates to the structure of a nanowire which is functionalized in a manner of self-organization, a production method thereof, and an electronic device incorporating the same.

BACKGROUND ART

Vigorous research and development is being performed for miniaturization the transistors in a large-scale integrated circuit (LSI) and the thin film transistors (TFTs) in a flat panel display. In a silicon semiconductor process, fine processing down to 0.1 µm or less is realized by reducing the wavelength of a light source for exposure used in a photolithography step. However, there are limits to the miniaturization by a conventional lithography technique. Moreover, with progress in miniaturization, costs of the exposure apparatus and the mask member are rapidly increasing.

In recent years, carbon nanotubes (Non-Patent Document 1) and nanowires which are made of a material exhibiting semiconductor-like properties (Patent Document 1) are drawing attention. Carbon nanotubes and nanowires are nanostructures with a diameter of about 2 nm to 1 µm, which can be formed via self-organization. Therefore, they present a potential of realizing high-performance nanometer-sized electronic devices, without employing any sophisticated lithography technique or etching technique. Such nanostructures are regarded promising as a technique for allowing high-performance devices to be produced at low cost, without employing complicated processing techniques.

Hereinafter, a conventional nanowire structure will be described with reference to FIG. 14.

FIG. 14(a) shows a schematic structural diagram of a nanowire. Generally speaking, a nanowire is a fine columnar structure having a diameter of about 1 nm to 1 µm. The length of this nanowire is about 500 nm to 1 mm, and can be appropriately set according to the application purposes.

FIG. 14(b) shows a nanowire 1002 having a core portion 1003 (inside) and a shell portion 1004 (outside) which are made of different materials (hereinafter referred to as a "coreshell nanowire")(Patent Document 2).

FIG. 14(c) shows a nanowire 1005 in which a first semiconductor nanowire 1006 and a second semiconductor nanowire 1007 are arranged along the length direction of the nanowire (hetero nanowire)(Patent Document 2).

In a usual hetero growth technique based on epitaxial growth technique, in order to reduce defects and dislocations, the lattice constants must be matched at the hetero interface, which imposes a constraint on the material choices. However, a nanowire having a pseudo one-dimensional structure presents a possibility that the stress due to a lattice constant mismatch can be alleviated, and thus provides an improved freedom of material choices.

Thus, nanowires, which can realize nanostructures and material engineering via self-organization, are considered as promising in the future.

[Patent Document 1] Japanese National Phase PCT Laid-Open Publication No. 2004-535066

[Patent Document 2] Japanese National Phase PCT Laid-Open Publication No. 2004-532133

[Non-Patent Document 1] R. Martel, et al., "Single- and multi carbon nanotube field-effect transistors," Appl. Phys. Lett. 73 pp. 2447, 1998

DISCLOSURE OF INVENTION

Problems to be Solved by the Invention

Nanowires are expected to be used in various applications, and are under vigorous research. However, since nanowires are very fine structures, it is very difficult to perform a further treatment, such as fine processing, for the surface or the interior of a nanowire to obtain an enhanced functionality.

The present invention has been made in view of the aforementioned problems, and an objective thereof is to provide a nanowire which is functionalized in a manner of self-organization, a device having a nanowire, and a production method thereof.

Means for Solving the Problems

A nanowire according to the present invention comprises: a nanowire body made of a first semiconductor material which contains a plurality of elements; and a plurality of nanoparticles made of a second semiconductor material which contains at least one of the plurality of elements and is different from the first semiconductor material, the plurality of nanoparticles being located at least one of an interior and a surface of the nanowire body.

In a preferred embodiment, the first semiconductor material and the second semiconductor material have different band gaps.

In a preferred embodiment, the plurality of nanoparticles are single-crystalline or polycrystalline.

A preferred embodiment has at least one first region in which the plurality of nanoparticles are located at at least one of the interior and the surface of the nanowire body and at least one second region in which the plurality of nanoparticles are not located at the interior or the surface of the nanowire body.

In a preferred embodiment, the first region and the second region are composed of different semiconductor materials.

In a preferred embodiment, the first semiconductor material is made of at least two elements selected from the group consisting of silicon, germanium, and carbon.

A light-emission device according to the present invention comprises: at least one nanowire; and a first electrode and a second electrode which are connected to the nanowire, wherein, the nanowire includes a nanowire body made of a first semiconductor material which contains a plurality of elements, and a plurality of nanoparticles made of a second semiconductor material which contains at least one of the plurality of elements and is different from the first semiconductor material, the plurality of nanoparticles being located in at least a portion of an interior and a surface of the nanowire body; and when a voltage is applied to the first electrode and the second electrode, at least a portion of the plurality of nanoparticles emits light.

In a preferred embodiment, in the nanowire, the plurality of nanoparticles are located in the interior of the nanowire body and covered by the first semiconductor material.

A photodetection device according to the present invention comprises: at least one nanowire; and a first electrode and a second electrode connected to the nanowire, wherein, the nanowire includes a nanowire body made of a first semiconductor material which contains a plurality of elements, and a plurality of nanoparticles made of a second semiconductor material which contains at least one of the plurality of elements and is different from the first semiconductor material, the plurality of nanoparticles being located in at least a portion of an interior and a surface of the nanowire body; and when light is incident on the plurality of nanoparticles, an electric current occurs between the first electrode and the second electrode.

In a preferred embodiment, the plurality of nanoparticles are present in the light-receiving region of the nanowire.

An electronic device according to the present invention comprises any of the above nanowires.

A production method for a nanowire according to the present invention comprises: step (A) of providing a substrate having catalyst metal particles disposed on a surface; step (B) of growing on the substrate a nanowire body being made of a first semiconductor material which contains a plurality of elements; and step (C) of forming, in at least a portion of a surface and an interior of the nanowire body, a plurality of nanoparticles being made of a second semiconductor material which contains at least one of the plurality of elements, wherein, step (C) includes: step (c1) of allowing the plurality of nanoparticles to precipitate on the surface of the nanowire body; and step (c2) of allowing at least a portion of the plurality of nanoparticles to move to the interior of the nanowire body.

In a preferred embodiment, step (c1) allows the plurality of nanoparticles to precipitate on the surface of the nanowire body by subjecting a surface of the first semiconductor material to a thermal oxidation.

In a preferred embodiment, step (c2) allows the plurality of nanoparticles to move by subjecting the nanowire body to a heat treatment in an inert gas ambient.

Effects of the Invention

A nanowire according to the present invention includes a plurality of nanoparticles which are located in at least a portion of the interior and the surface of a nanowire body being made of a first semiconductor material, and the nanoparticles are made of a second semiconductor material. As a result, various devices can be realized.

Moreover, in a production method for a nanowire according to the present invention, it is unnecessary to perform a treatment such as fine processing to the surface or the interior of the nanowire for the purpose of forming nanoparticles. Therefore, it is possible to eliminate complexity of the production process and poorness of reproducibility and productivity. Furthermore, factors that affect the device characteristics, e.g., the density and particle size of the particles, can be easily controlled.

Figure 1:
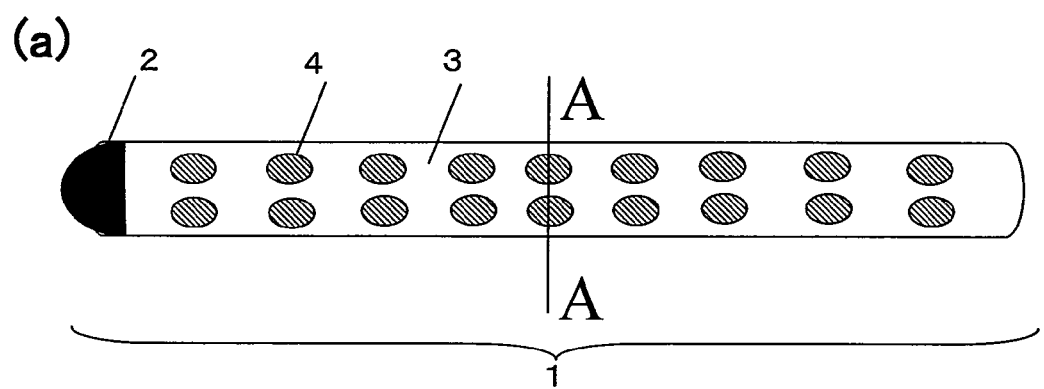
FIG. 1 (a) is a cross-sectional view showing a nanowire according to the present invention; and (b) is a cross-sectional view thereof along line A-A.
Figure 1:
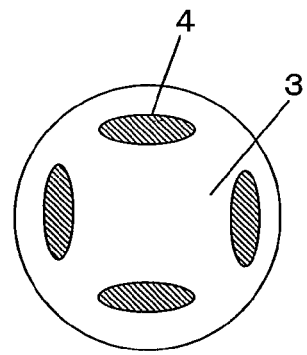

DESCRIPTION OF REFERENCE NUMERALS 1 semiconductor particle-containing nanowire
2 catalyst metal
3 nanowire body
4 semiconductor particle
5 substrate
6 source gas
110 Ge particle-containing SiGe nanowire
111 SiGe nanowire body
112 Ge particle
113 silicon oxide film
114 silicon substrate
115 catalyst particle
116 source gas (disilane gas, germane gas)
201 nanowire light-emission device
202 hetero nanowire
203 substrate
204a first electrode
204b second electrode
205 semiconductor particle-containing nanowire
206 contact layer nanowire
301 multi Ge particle-containing nanowire
302 region where Ge particles are absent
303 region where Ge particles exist
304 SiGe nanowire
305 Ge particle 306 catalyst particle
307 substrate
308 source gas
309 Si nanowire
310 SiGe nanowire
311 nanowire light-emission device
312 substrate
313 first electrode
314 second electrode
401 Ge particle-containing doped hetero nanowire
402 Ge particle-containing nanowire
403 p-Si nanowire
404 n-Si nanowire
405 nanowire photodetection device
406 substrate
407 first electrode
408 second electrode
1001 semiconductor nanowire
1002 core-shell nanowire
1003 core portion
1004 shell portion
1005 hetero nanowire
1006 first semiconductor nanowire
1007 second semiconductor nanowire

BEST MODE FOR CARRYING OUT THE INVENTION

First, with reference to FIG. 1, a nanowire according to the present invention will be described. FIG. 1(a) is a perspective view of a nanowire according to the present invention; and FIG. 1(b) is a cross-sectional view along line A-A in FIG. 1(a).

The nanowire shown in the figure is a nanowire having semiconductor particles located in the interior of a nanowire body (hereinafter referred to as a "semiconductor particle-containing nanowire"). The semiconductor particle-containing nanowire 1 shown in FIG. 1 is structured so that a catalyst metal 2 is included at one end of the nanowire body, with a plurality of semiconductor particles 4 located in the interior and on the surface of the nanowire body 3. The semiconductor particles 4 are made of a semiconductor material (second semiconductor material) which is different from the semiconductor material (first semiconductor material) which the nanowire body is made of. More specifically, the nanowire body is made of a first semiconductor material containing a plurality of elements, whereas the nanoparticles are made of a second semiconductor material containing at least one element that is included among the plurality of elements which the first semiconductor material is made of.

For example, the nanowire body 3 may be made of a IV group semiconductor such as SiGe or SiGeC, a III-V group semiconductor such as GaAs, InP, or InAs, or a II-VI group semiconductor such as ZnS, ZnSe, or CdS. On the other hand, the semiconductor nanoparticles 4 are made of Si or Ge in the case where the nanowire body 3 is made of SiGe, for example.

For example, the catalyst metal 2 may be made of metal atoms such as gold, silver, copper, nickel, cobalt, iron, or titanium, or an alloy or composite material between such metal atoms and the material composing the nanowire body 3. The catalyst metal 2 can be removed after the nanowire is formed, and thus, the final semiconductor particle-containing nanowire does not need to include the catalyst metal 2.

The average particle size of the semiconductor particles 4 is about 1 nm to 100 nm. The cross section of each semiconductor particle typically has a shape which is close to a circle or an ellipse, but may be of various shapes including polygons, or may be layered. The semiconductor particles 4 are single-crystalline or polycrystalline.

The semiconductor particle-containing nanowire 1 has a length of e.g. about 1 μm to 100 μm, with a diameter of e.g. about 2 nm to 1 μm. Since the nanowires are thus in the shape of thin wires, it is very difficult to subject them to any fine processing for conferring various functions thereto. However, according to a preferable example of the present invention, at least a portion of the plurality of semiconductor particles 4 which are formed via self-organization are located in the interior of the semiconductor nanowire, and it is possible to exhibit various functions when the semiconductor particles 4 are covered with the first semiconductor material composing the nanowire body 3, it is possible to efficiently inject carriers such as electrons and holes into the semiconductor particles 4 through the nanowire body 3.

Next, with reference to FIGS. 2(a) to (d), an example of a production method for the semiconductor particle-containing nanowire according to the present invention will be described. FIGS. 2(a) to (d) are step diagrams showing a production method for the nanowire according to the present invention. Growth of the nanowire can be performed by the vapor-liquid-solid (VLS) growth mechanism, which is a known method.

Figure 2:
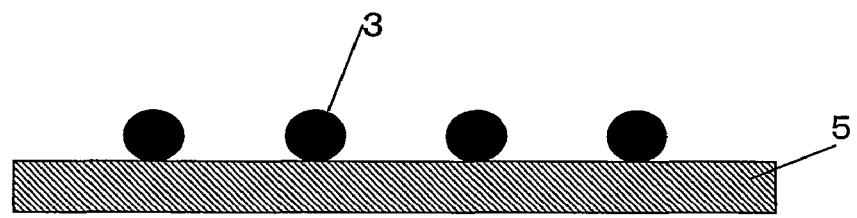
FIG. 2 (a) to (d) are step diagrams showing a production method for a nanowire according to the present invention.
Figure 2:
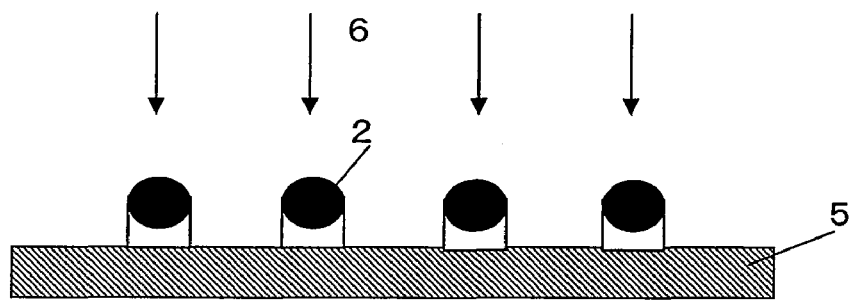
Figure 2:
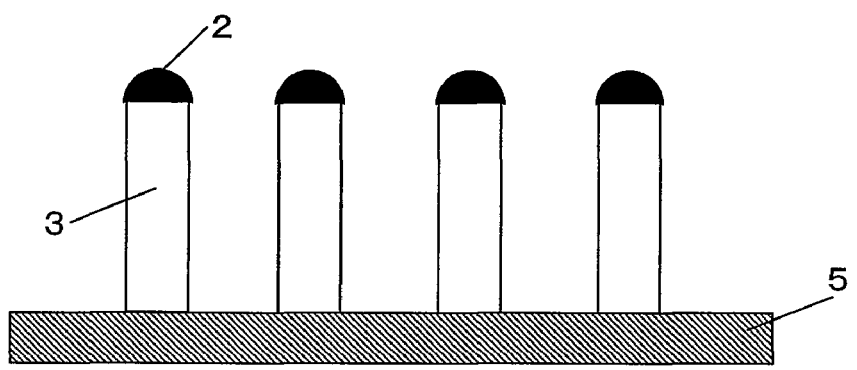
Figure 2:
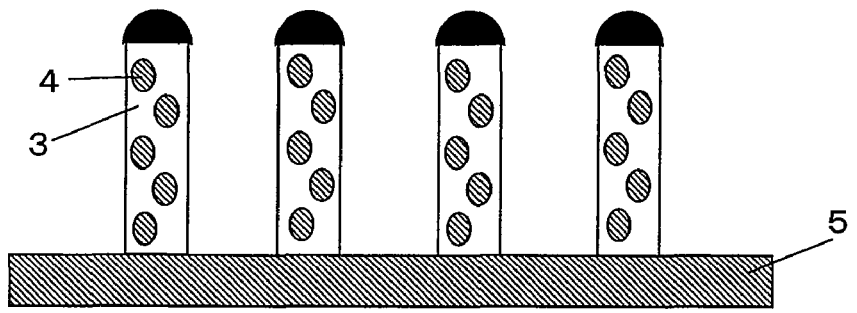

First, as shown in FIG. 2(a), a catalyst metal 2 is placed on an arbitrary substrate 5. As for the placement method, it can be placed on the substrate 5 with a method of applying a metal colloid solution by spin coating technique, or with a method of depositing a thin metal film by sputtering technique or vapor deposition technique and granulating the thin metal film, for example.

Next, the substrate 5 having the catalyst metal 2 placed thereon is introduced into a chamber of a CVD apparatus or the like. As shown in FIG. 2(b), source gas 6 containing elements composing the nanowire are introduced into the chamber, which is retained at a predetermined pressure. The substrate 5 is heated by a lamp, a heater, or the like, so that the substrate is kept at an arbitrary temperature. In this situation, the source gas 6 will be selectively decomposed only in the vicinity of the catalyst metal 2. The catalyst metal 2 reacts with the decomposed source gas 6, whereby an alloy between the catalyst metal 2 and the elements composing the nanowire is formed.

Next, as shown in FIG. 2(c), the elements composing the nanowire, which has been generated through decomposition of the source gas 6, are dissolved into the alloy between the catalyst metal 2 and the elements composing the nanowire, thus entering a supersaturated state. From this alloy between the catalyst metal 2 and the elements composing the nanowire in a supersaturated state, an element(s) composing the nanowire is allowed to precipitate, and as the element(s) having precipitated congregates, a crystalline semiconductor (nanowire body 3) grows. Herein, the crystalline semiconductor needs to be composed of two or more elements, with the introduction of a plurality of source gases.

Next, through a heat treatment step which will be described later, a portion of the plurality of elements composing the semiconductor material of the nanowire body 3 is allowed to precipitate and segregate. Therefore, as shown in FIG. 2(d), particles 4 made of the second semiconductor, which mainly contains the aforementioned plurality of elements, are formed in the interior or on the surface of the nanowire body. The detailed conditions of the heat treatment to be performed for forming such semiconductor particles 4 will be described later.

Hereinafter, preferred embodiments of the present invention will be described.

Embodiment 1

Figure 4:
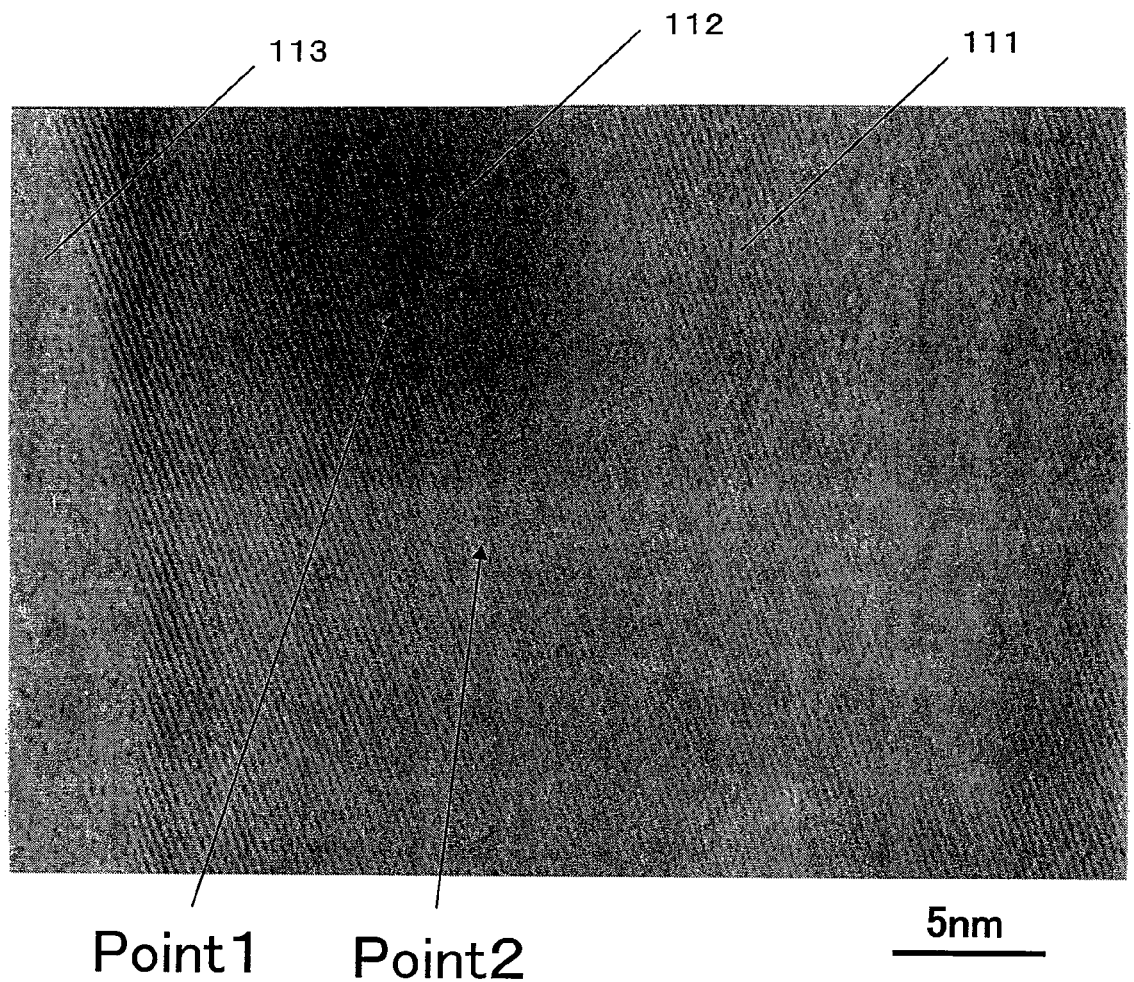
FIG. 4 A photograph showing an enlarged TEM image of a nanowire of Embodiment 1.
Figure 5:
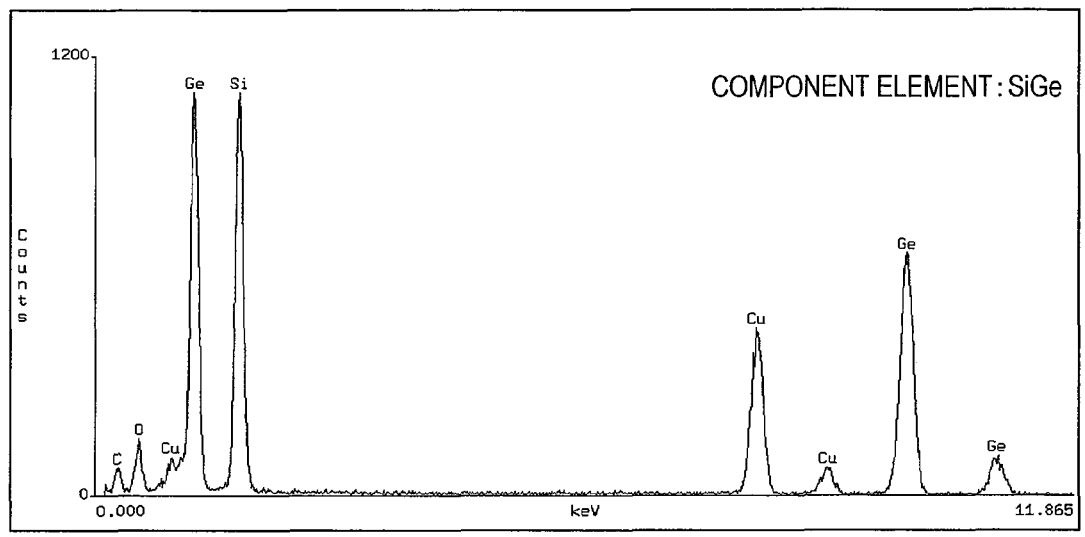
FIG. 5 (a) and (b) are graphs showing results of an element analysis for a nanowire of Embodiment 1.
Figure 5:
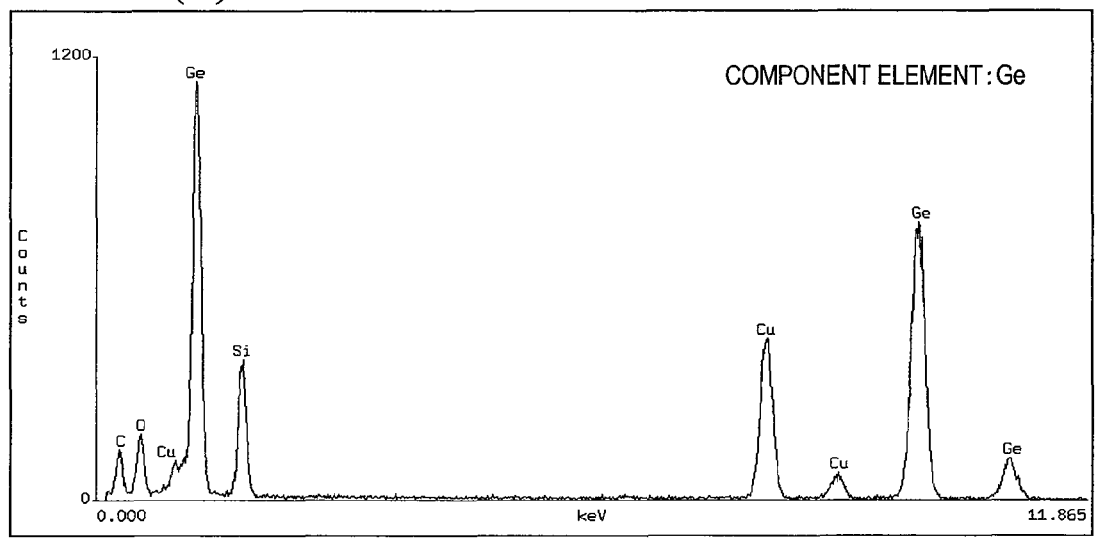

First, with reference to FIG. 3 to FIG. 5, a first embodiment of the nanowire according to the present invention will be described. The nanowire of the present embodiment is a nanowire such that germanium (Ge) particles are contained in a silicon germanium nanowire (SiGe) body, and hereinafter will be referred to as a "Ge particle-containing SiGe nanowire".

Figure 3:
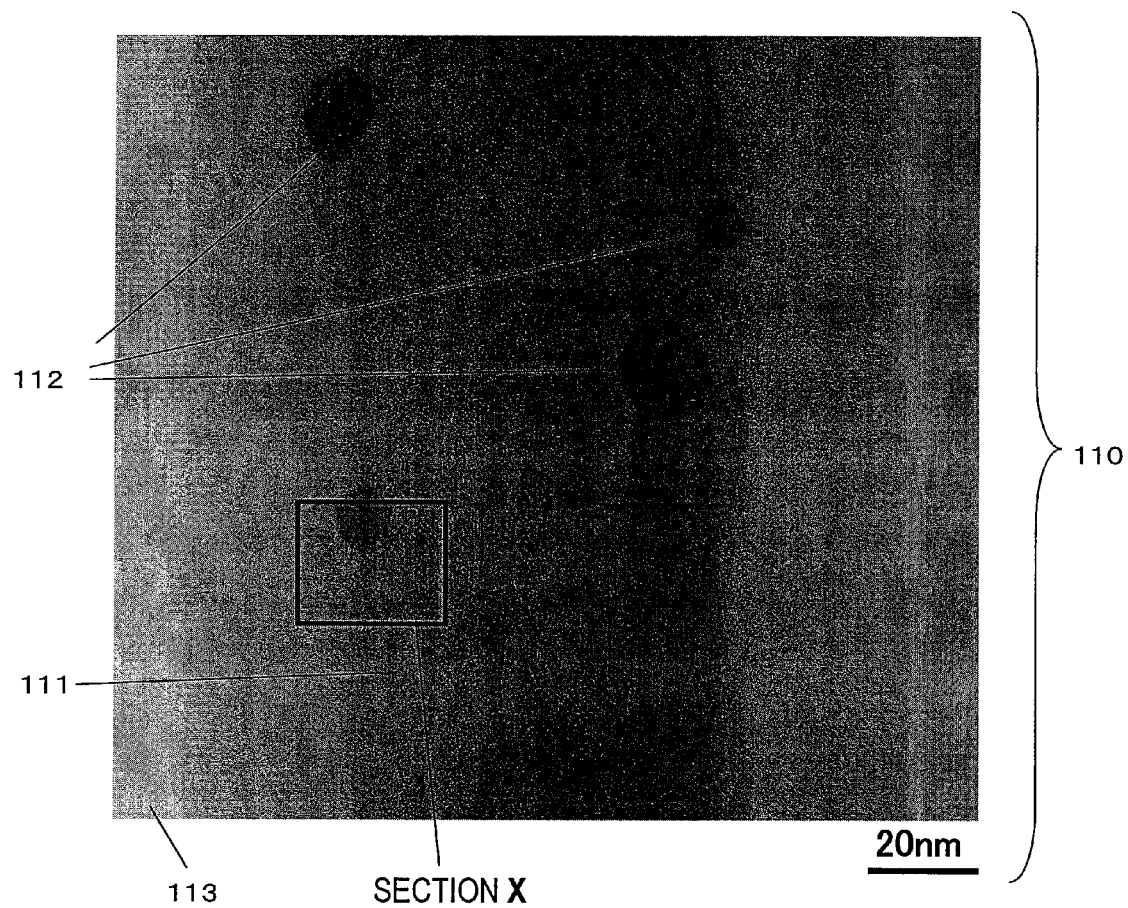
FIG. 3 A photograph showing a TEM image of a nanowire of Embodiment 1.

FIG. 3 is a photograph showing an example of a transmission electron microscope (TEM) image of the Ge particle-containing SiGe nanowire 110 according to the present embodiment. FIG. 4 is a photograph showing an enlarged TEM image of section X in FIG. 3. FIG. 5(a) is a graph showing an element analysis result of the region of point 2 in FIG. 4, whereas FIG. 5(b) is a graph showing an element analysis result of the region of point 1 in FIG. 4.

The Ge particle-containing SiGe nanowire 110 shown in FIG. 3 is structured so that a plurality of Ge particles 112 are located in the interior of a SiGe nanowire body 111. In the present embodiment, a core-shell structure is formed such that the periphery of the SiGe nanowire body 111 is covered with a silicon oxide film having a film thickness of about 30 nm. From the result of the enlarged TEM image shown in FIG. 4, it can be seen that the Ge particles 112 and the SiGe nanowire body 111 each have a single-crystalline structure. From the element analysis results shown in FIG. 5, it can be seen that the particulate sites shown in FIG. 3 and FIG. 4 are composed of the germanium element, whereas the other regions are composed of the silicon and germanium elements. Thus, the Ge particle-containing SiGe nanowire 110 is structured so that, in the interior of the nanowire body 111 composed of SiGe, the plurality of particles 112 composed of the germanium element with a particle size of about 10 nm to 20 nm (bulk band gap: 0.66 eV) are formed via self-organization. Note that the band gap of SiGe in a bulk state changes depending on the mole fraction ratio of Ge. For example, in the case of $Si_{0.8}Ge_{0.2}$, its band gap is about 0.9 eV. In a subsequently-described production process, the Ge particles 112 can be formed while their particle size is controlled in the range from about 1 nm to 100 nm. Moreover, the positions of the Ge particles in a cross section perpendicular to the longitudinal direction of the SiGe nanowire body 111 can also be controlled in the production process.

The Ge particle-containing SiGe nanowire 110 having the fine Ge particles 112 of about 1 nm to 100 nm being formed on the surface of the nanowire body 111 via self-organization is expected to possess a broad applicability to electronic devices such as transistors and light-emission devices.

Next, with reference to FIGS. 6(a) to (d), an example of a production method for the nanowire of the present embodiment will be described.

Figure 6:
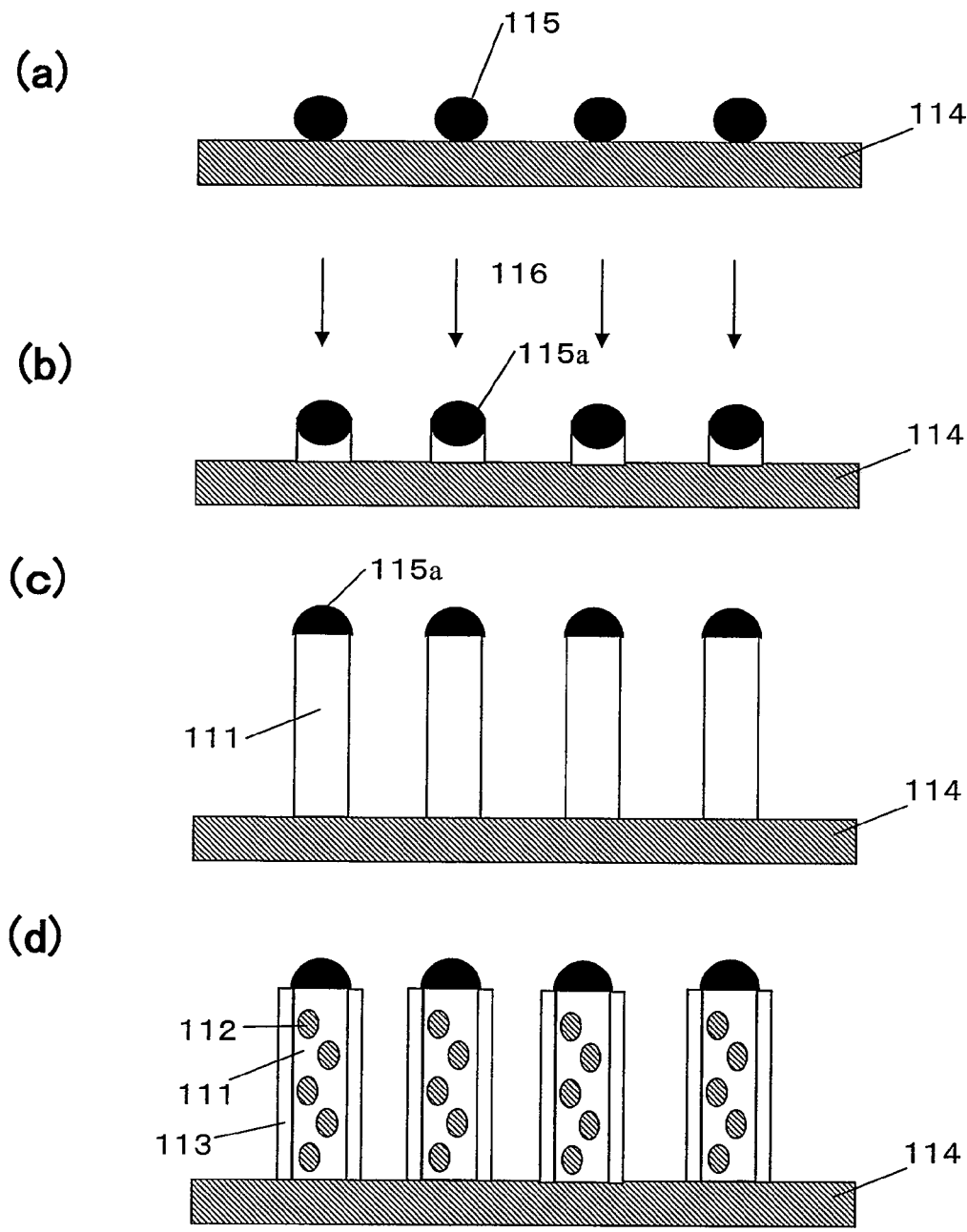
FIG. 6 (a) to (d) are step diagrams showing a production method for a nanowire of Embodiment 1.

First, as shown in FIG. 6(a), a silicon substrate 114 functioning as a growth substrate is provided, and catalyst particles 115 are formed on the silicon substrate 114. So long as the growth substrate 114 is thermally resistant against the heat treatment temperature during the nanowire growth, it is possible to use what is obtained by depositing e.g. a silicon oxide film, a silicon nitride film, or the like on a substrate which is made of another semiconductor material, an insulative material, a refractory metal material, or the like. The surface orientation and the resistivity of the growth substrate 114 may be arbitrarily set.

In the present embodiment, gold is used as the catalyst particles 115. The catalyst particles 115 well promote decomposition of source gas, and are used to create a eutectic state with the elements composing the nanowire and promote growth of the nanowires. Since the diameter of a nanowire body 111 to grow is substantially equal in size with a catalyst particle 115, the size of the catalyst particles is set so that nanowires of a desired diameter will be obtained. Usually, the diameter of a catalyst particle 115 is 1 nm to 10000 nm, and preferably in the range from 5 nm to nm.

As the method for growing the catalyst particles 115 on the growth substrate 114, known methods can be used. For example, a thin film of a catalyst metal is formed on the surface of the growth substrate 114 by using a known thin film formation apparatus based on sputtering technique, vapor deposition technique, or the like. Thereafter, this thin film of catalyst metal may be subjected to a heat treatment to cause self-congregation of the thin film of catalyst metal.

As the method for forming the gold particles, for example, by using EB vapor deposition technique, a thin film of gold of about 0.5 nm to 10 nm may be deposited, and subjected to a heat treatment at 500° C. for about 30 minutes to 3 hours. Since the diameter of the gold particles depends on the thickness of the thin film of gold and the heat treatment conditions, the thickness of the thin film of gold is to be adjusted so that the desired gold particle diameter is obtained. In the present embodiment, a thin film of gold with a thickness of about 2 nm is deposited, and is subjected to a heat treatment at 500° C. for 10 minutes in a vacuum.

Next, the growth substrate 114 having the catalyst particles 115 formed thereon is inserted in a chamber such as a CVD apparatus. Then, as shown in FIG. 6(b), source gas 116 containing the silicon and germanium elements is introduced into the chamber, which is kept at a predetermined pressure, and the growth substrate 114 is heated at a temperature that is lower than the temperature at which the source gas 116 will decompose. As a result, the elements in the source gas 116 having been decomposed at the surface of the catalyst particles 115 (the elements composing the nanowire) react with the catalyst particles 115, whereby an alloy of them is formed.

As the source gas 116 for forming SiGe nanowires, a silicon source gas such as $SiH_4$, $Si_2H_6$, $Si_3H_8$, $SiH_2Cl_2$, or $SiCl_4$ and a germanium source gas such as $GeH_4$, $Ge_2H_6$, $GeH_2Cl_2$, or $GeCl_4$ can be used.

In the present embodiment, an ultra high vacuum CVD apparatus is used as a CVD apparatus, and a substrate temperature which is between 350° C. and 500° C. is set. As the source gas, $Si_2H_6$ gas and $GeH_4$ gas are used, and the flow rates of $Si_2H_6$ gas and $GeH_4$ gas are adjusted within the range from 10 to 500 sccm so that the pressure within the chamber is $10^{-5}$ Torr to 1 Torr. Other than these source gases, $H_2$ gas, He gas, or Ar gas may be simultaneously introduced into the growth chamber as a seed gas. Under such conditions, SiGe nanowires can be grown at a growth rate of 0.05 μm/min to 10 μm/min, for example.

Through decomposition of the source gas 116, silicon and germanium, which are the elements composing the nanowires, precipitate. The silicon and germanium having precipitated will congregate, whereby a crystalline semiconductor grows in the form of wires. In this manner, the SiGe nanowire bodies 111 as shown in FIG. 6(c) are formed. The Ge content (Ge mole fraction) in each SiGe nanowire body 111 can be controlled based on the ratio of the flow rate of the $GeH_4$ gas to the total flow rate of the $Si_2H_6$ gas and the $GeH_4$ gas. For example, if growth is conducted under the condition that $Si_2H_6$ gas flow rate: $GeH_4$ gas flow rate=1:1, SiGe nanowire bodies with a Ge mole fraction of about 20 at % can be grown.

Next, the SiGe nanowire bodies 111 are subjected to thermal oxidation under predetermined conditions as will be described later, whereby Ge particle-containing SiGe nanowires containing the Ge particles 112 can be formed as shown in FIG. 6(d). Since the aforementioned thermal oxidation progresses from the outer peripheral surface of each SiGe nanowire body 111 toward the central portion thereof, a structure is formed in which the surface of the SiGe nanowire body 111 is covered with an oxide film. By adjusting the conditions of thermal oxidation, only the Si element in each SiGe nanowire body 111 can be selectively oxidized, thus making it possible to cover the periphery of the SiGe nanowire body 111 with a silicon oxide film. By thus selectively oxidizing Si, the Ge element in SiGe is allowed to segregate at the interface between the SiGe nanowire body 111 and the silicon oxide film. By allowing the Ge element which has thus segregated to grow into Ge particles, the Ge particle-containing SiGe nanowires 110 can be obtained.

In the present embodiment, through the aforementioned thermal oxidation, the Ge particles 112 located in the interior of the SiGe nanowire body 111 are formed via self-organization. In order to form the Ge particles 112 located in the interior of the SiGe nanowire body 111 from the Ge which has segregated at the interface between the SiGe nanowire body 111 and the silicon oxide film, the conditions of the aforementioned thermal oxidation may be controlled as appropriate. Specifically, for example, a high-temperature high-speed oxidation at 1100° C. may be performed for 5 minutes in an oxygen ambient.

By adjusting the conditions of the thermal oxidation and the structure of the SiGe nanowire body 111, the particle size and density of the Ge particles 112 can also be controlled. For example, the particle size and density of the Ge particles 112 can be increased as the mole fraction ratio of Ge in the SiGe nanowire body 111 is increased. Moreover, the particle size and density of the Ge particles 112 can be increased as the oxygen concentration in the oxidation ambient gas and the thermal oxidation temperature are increased.

Hereinafter, preferable conditions for the aforementioned heat treatment step will be described.

(Regarding Oxidation Temperature)

First, Raman spectra of SiGe nanowires subjected to thermal oxidation at different temperatures were measured.

Figure 15:
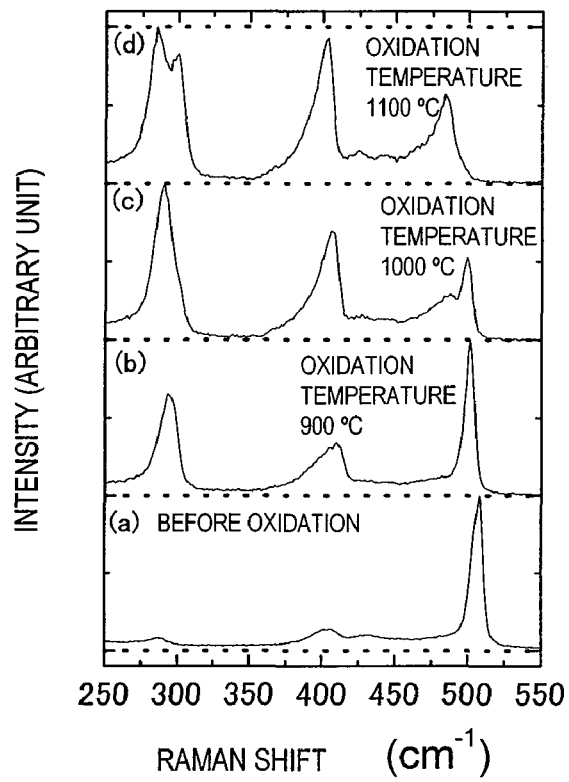
FIG. 15 A graph showing results of measuring a Raman spectrum with respect to samples which are subjected to thermal oxidation at different temperatures.

FIG. 15 is a graph showing Raman spectra of samples which were subjected to thermal oxidation at different temperatures. Profile (a) shown in FIG. 15 is a Raman spectrum of a SiGe nanowire which has not been subjected to thermal oxidation. On the other hand, profiles (b), (c), and (d) shown in FIG. 15 are Raman spectra of SiGe nanowires which are subjected to thermal oxidation at 900° C., 1000° C., and 1100° C., respectively. The horizontal axis of FIG. 15 represents the wave number, and peaks which are observed near 300 $cm^{-1}$, 400 $cm^{-1}$, and 500 $cm^{-1}$ are ascribable to the vibration modes of Ge—Ge, Si—Ge, and Si—Si, respectively. Note that the thermal oxidation was performed by heating the sample for 4 minutes in an oxygen-containing ambient by RTO technique (Rapid Thermal Oxidation).

As shown by profiles (a) to (d) in FIG. 15, as the thermal oxidation temperature increases, the Si—Si mode peak is shifted toward the lower wave number side, and its intensity decreases. On the other hand, as the thermal oxidation temperature increases, the intensity of the Ge—Ge mode peak is increased. These results indicate that, as the thermal oxidation temperature increases, oxidation of Si is promoted and thus the mole fraction ratio of Ge increases. Moreover, as shown by profile (d) in FIG. 15, the Ge—Ge peak of the sample which is subjected to thermal oxidation at 1100° C. is separated into two. This result indicates that at least two types of Ge—Ge vibration are being observed. In the already-described TEM images (FIG. 3 and FIG. 4), Ge particles are formed when a heat treatment is conducted at 1100° C.; this gives a reason to believe that the two peaks shown in profile (d) are caused by the Ge particles in the SiGe nanowire and by some other region. In other words, in the sample which is subjected to thermal oxidation at 1100° C., the state of Ge in the Ge particles and the state of Ge in other regions are clearly distinguishable.

Figure 16:
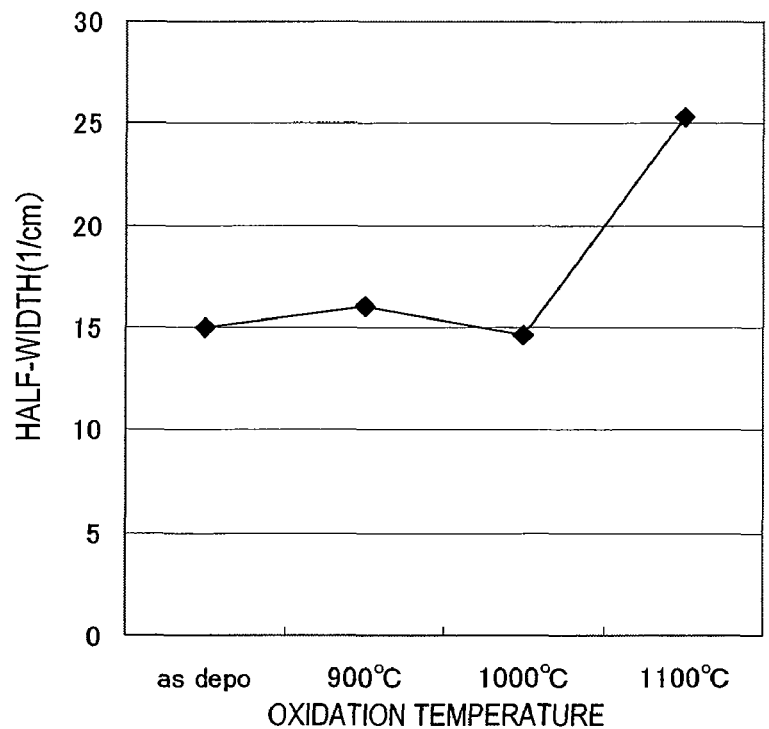
FIG. 16 A graph showing a relationship between the thermal oxidation temperature of a SiGe nanowire and the half-width of a Ge—Ge mode peak.

FIG. 16 is a graph showing a relationship between the thermal oxidation temperature of a SiGe nanowire and the half-width of a Ge—Ge mode peak. As shown in FIG. 16, when the thermal oxidation temperature exceeds 1000° C., the half-width is greatly increased. According to these results, in order to generate Ge particles, thermal oxidation may be performed at a temperature preferably exceeding 1000° C., and more preferably at a temperature of 1100° C. or more.

Since the oxidation rate increases as the thermal oxidation temperature becomes higher, it is considered that Ge particles are more likely to be formed as the oxidation rate is increased. Therefore, preferably, the temperature elevation rate for thermal oxidation should also be as high as possible. The reason is that, as the temperature elevation rate increases, there is less region to be oxidized during the process of temperature elevation and more region to be oxidized after the temperature elevation is completed.

(Regarding Oxidation Time)

Figure 17:
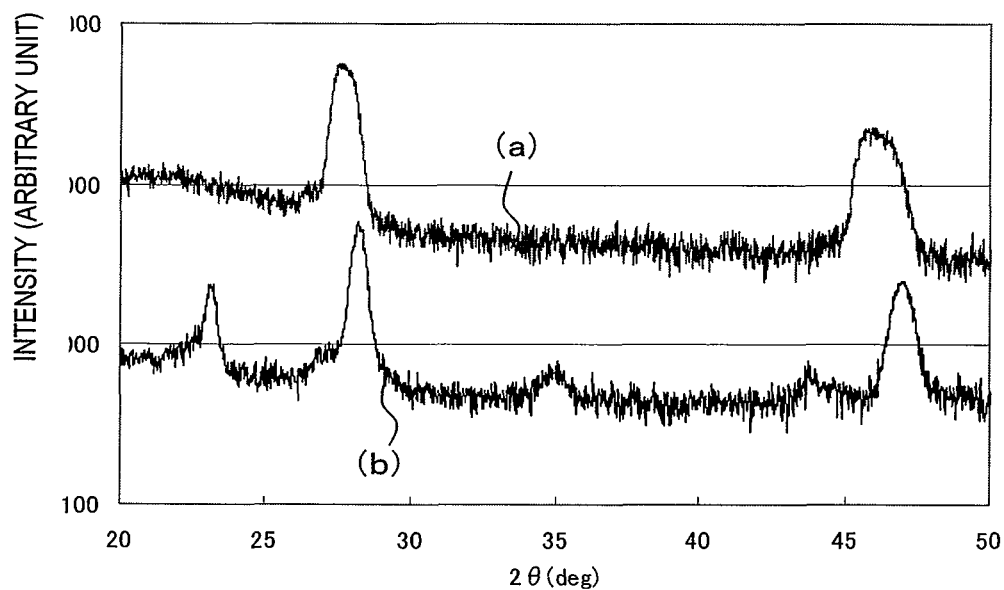
FIG. 17 A graph showing XRD spectra of SiGe nanowires.

Next, XRD (X-ray diffraction) measurements were conducted for samples with different oxidation times, and the half-widths of peaks were compared. FIG. 17 is a graph showing XRD spectra of SiGe nanowires. The peaks of the SiGe nanowires are observed near 27° and 47°, where the 27° peak represents a signal due to diffraction from the (111) plane and the 47° peak represents a signal due to diffraction from the (220) plane. Profile (a) represents an XRD spectrum of a sample which is subjected to thermal oxidation at 1100° C. for 6 minutes, whereas profile (b) represents an XRD spectrum of a sample which has not been subjected to thermal oxidation (as deposited). In profile (a), the peak positions are shifted toward the lower angle side and the peak widths are wider than in profile (b). This result indicates that, in the sample which is subjected to thermal oxidation at 1100° C. (profile (a)), regions with different Ge mole fractions (Ge particles) have occurred in the SiGe nanowire.

Figure 18:
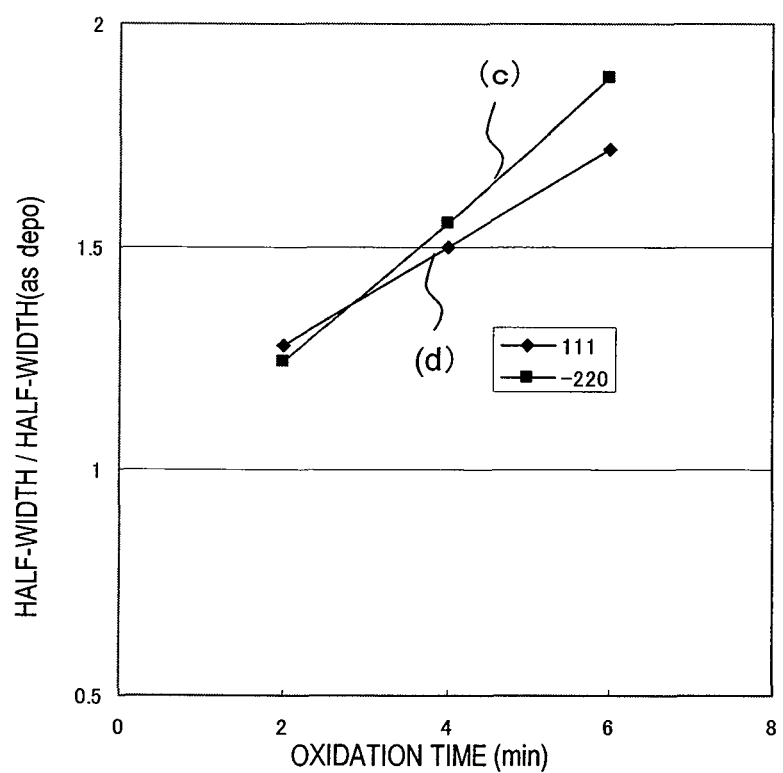
FIG. 18 A graph showing how the half-width of an XRD spectrum changes as the oxidation time is changed.

FIG. 18 is a graph showing how the half-width of an XRD spectrum changes as the oxidation time is changed. The horizontal axis of FIG. 18 represents oxidation time for an SiGe nanowire, whereas the vertical axis represents a value (half-width/half-width (as deposited)) obtained by dividing the half-width value of a sample which is subjected to thermal oxidation at 1100° C. by the half-width of a sample which has not been subjected to thermal oxidation (as deposited). Profile (c) shows the half-width of a signal due to diffraction from the (220) plane, whereas profile (d) shows the half-width of a signal due to diffraction from the (111) plane. As h FIG. 18, in both of profiles (c) and (d), the value on the vertical axis is increased as the oxidation time increases. In other words, as the oxidation time becomes longer, the half-width of the sample after thermal oxidation is increased. This result indicates that the Ge particles become more likely to be formed as the thermal oxidation time becomes longer.

(Regarding Oxygen Concentration)

Figure 19:
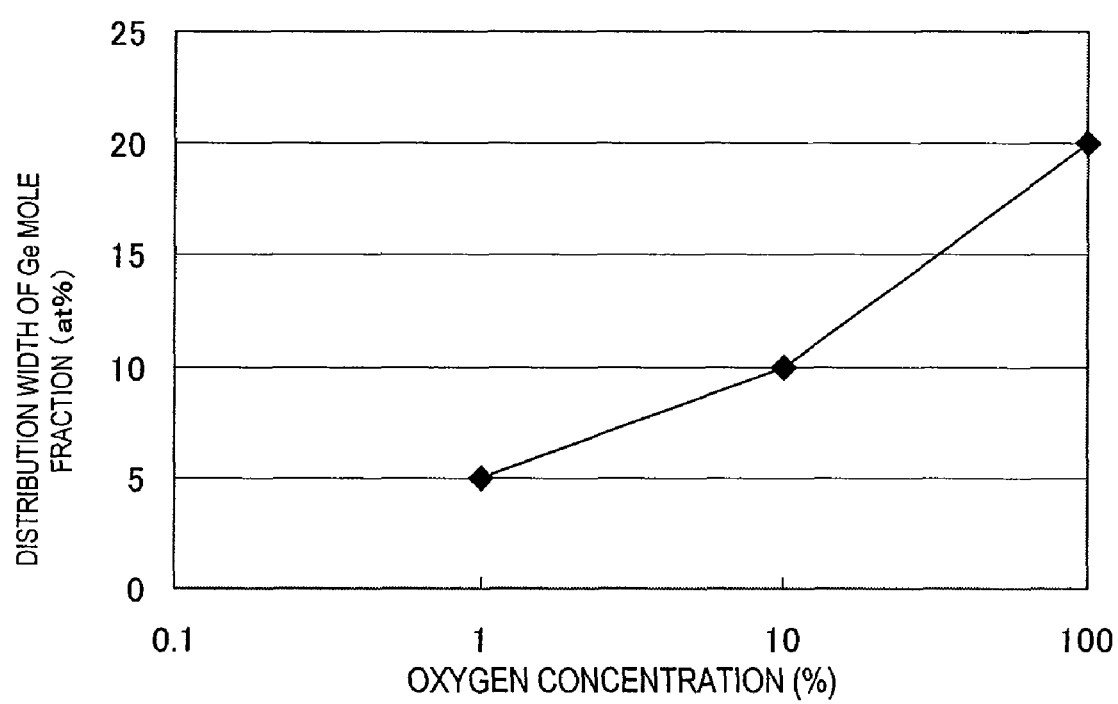
FIG. 19 A graph showing a relationship between variations in the Ge mole fraction of a SiGe nanowire and the oxygen concentration in a thermal oxidation ambient.

Next, the distribution of a Ge mole fraction in the SiGe nanowire was compared among a plurality of samples which were oxidized in ambients with different oxygen concentrations. FIG. 19 is a graph showing a relationship between the distribution width of the Ge mole fraction of a SiGe nanowire and the oxygen concentration in a thermal oxidation ambient. The distribution width of the Ge mole fraction was calculated as follows, based on measurement results of the Raman spectrum. First, wave numbers of the Raman spectrum were substituted for the respective ω's of the three following empirical equations (1) to (3), and the values of x, y, and z were calculated. Note that x, y, and z represent the mole fraction ratios of Ge (at %) as calculated from the respective wave numbers (ω) of Si—Si, Si—Ge, and Ge—Ge.

$$\omega_{Si-Si} = 520.2 - 62x \quad \text{eq. (1)}$$

$$\omega_{Si-Ge} = 100.5 + 14.2y \quad \text{eq. (2)}$$

$$\omega_{Ge-Ge} = 282.5 + 16z \quad \text{eq. (3)}$$

If the mole fraction of Ge in the SiGe nanowire is uniform, the x, y, and z values will be equal; as there are greater variations among these values, the non-uniformity of the Ge mole fraction is also greater. Therefore, from the x, y, and z values, it is possible to calculate a state of distribution of the Ge mole fraction. The distribution width of the Ge mole fraction on the vertical axis shown in FIG. 19 is a value which is obtained by subtracting the minimum value from the maximum value among x, y, and z. On the other hand, the horizontal axis of FIG. 19 represents a proportion (%) accounted for by the partial pressure of oxygen, against the total pressure of the ambient gas.

As shown in FIG. 19, as the oxygen concentration increases, the distribution width of the Ge mole fraction also increases. This result indicates that, as the oxygen concentration is increased, the oxidation rate increases and therefore the Ge particles become more likely to be formed.

Next, a step to be performed after the thermal oxidation treatment will be described. In order to move the Ge particles 112 in the center direction of the SiGe nanowire body 111, a non-oxidizing heat treatment may be performed after the thermal oxidation treatment. Through this non-oxidizing heat treatment, the Ge which has segregated at the interface between the SiGe nanowire body 111 and the silicon oxide film grows into particulate forms while diffusing toward the central portion of the SiGe nanowire body 111. However, the detailed mechanism of such movements of the Ge particles 112 in the center direction of the SiGe nanowire body 111 has not become clear yet.

As the non-oxidizing heat treatment for moving the Ge particles 112, for example, a heat treatment at 800° C. to 1100° C. can be performed in an inert gas ambient, e.g., nitrogen, or in a vacuum. Thus, according to the present embodiment, a large number of Ge particles can be formed without performing a fine processing using lithography and etching technique for the nanowire body.

Note that the semiconductor which has precipitated through a thermal oxidation treatment may move during the thermal oxidation treatment toward the center of the nanowire and grow into nanoparticles. In this case, there is no need to add any special heat treatment after the thermal oxidation treatment.

In a Ge particle-containing SiGe nanowire that is finally obtained, it is not necessary that all of the plurality of Ge particles 112 are located in the interior of the SiGe nanowire body 111. However, rather than the case where some or all of the Ge particles 112 are exposed from the outer peripheral surface of the SiGe nanowire body 111 and ruggednesses are formed on the nanowire surface, it is more preferable that most of the plurality of Ge particles 112 are completely included in the interior of the SiGe nanowire body 111 so that the nanowire surface is smoothing. The reason is that, if the nanowire surface is smoothed, the density of surface defects is reduced and the emission characteristics or the photodetection characteristics are improved.

Thus, the present invention has a first feature in that, after a nanowire body is formed from a first semiconductor material which is made of a plurality of elements, nanoparticles of a second semiconductor material which is made of a portion of the elements composing the first semiconductor material. It has a second feature in that at least a portion of these nanoparticles are located in the interior of the nanowire.

The silicon oxide film formed in the periphery of the SiGe nanowire body 111 may be removed after the aforementioned oxidation treatment. Moreover, before the oxidation treatment, the catalyst particles 115 may be removed. The reason is that, if the catalyst particles 115 are in contact with the nanowire body 111 at the time of the oxidation treatment, the metal composing the catalyst particles 115 may diffuse into the interior of the nanowire body 111 during the thermal oxidation treatment, thus deteriorating or denaturing the semiconductor characteristics of the nanowire body 111. If the catalyst particles 115 are removed at the time of the oxidation treatment, the metal composing the catalyst particles 115 can be restrained from diffusing into the interior of the nanowire body 111.

By changing the source gas, the material composing the nanowire body can be changed. For example, in the case where nanowires of silicon germanium carbon (SiGeC) are to be grown, silane gas, germane gas, or methyl silane may be used as the source gas.

The semiconductor particles which are located in the interior of the nanowire body 111 can be formed without adding any special production steps other than the heat treatment, and the particle size and particle density thereof can also be controlled by changing the thermal oxidation conditions and the nanowire structure. According to the present embodiment, fine Ge particles can be formed in the body of a nanowire by using a known nanowire growing apparatus, and also density control and particle size are possible, and thus applications to electronic devices such as transistors and light-emission devices are expectable.

Moreover, in a nanowire, a higher proportion is occupied by the surface relative to its volume, than in a bulk of semiconductor. Therefore, there is an advantage in that thermal oxidation rapidly progresses, thus promoting generation of Ge particles.

Embodiment 2

Next, with reference to FIG. 7, an embodiment of a nanowire light-emission device according to the present invention will be described. This light-emission device includes a light-emitting region which is made of semiconductor particle-containing nanowires. A nanowire of the present embodiment has a hetero structure such that a semiconductor particle-containing nanowire and nanowires for contact purposes which do not contain any semiconductor particles are jointed. Hereinafter, such a nanowire will be referred to as a "hetero nanowire".

FIG. 7(a) is a cross-sectional view showing the structure of a hetero nanowire 202 in the present embodiment, whereas FIG. 7(b) is a perspective view showing a nanowire light-emission device 201 in which the hetero nanowires 202 are used. Hereinafter, the structure of the nanowire light-emission device 201 will be described.

In the hetero nanowire 202 shown in FIG. 7(a), nanowires 206 for contact purposes are connected to both ends of a semiconductor particle-containing nanowire 205. The nanowires 206 for contact purposes at both ends may be doped with an impurity in order to form good contacts with electrodes. For example, in the case where the nanowires 206 for contact purposes are made of silicon, they are doped with about $1\times10^{18}$ atoms/cm$^{-3}$ to $1\times10^{20}$ atoms/cm$^{-3}$ of a III group element such as boron, or a V group element such as phosphorus or arsenic.

Figure 7:
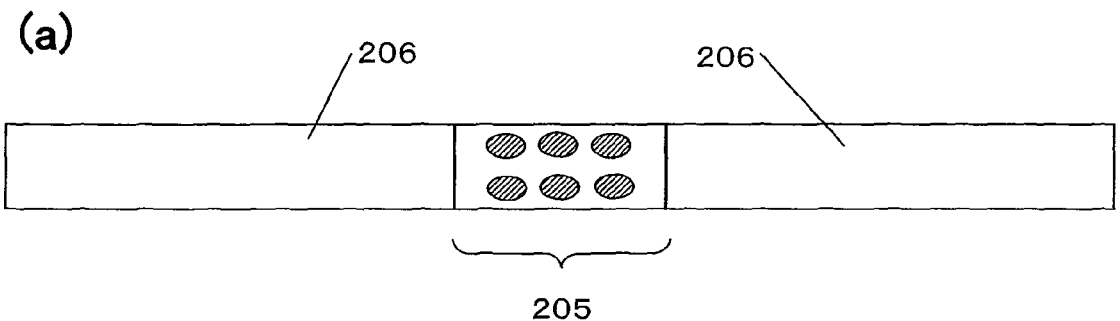
FIG. 7 (a) is a cross-sectional view showing a nanowire of Embodiment 2; and (b) is a perspective view of a nanowire light-emission device of Embodiment 2.
Figure 7:
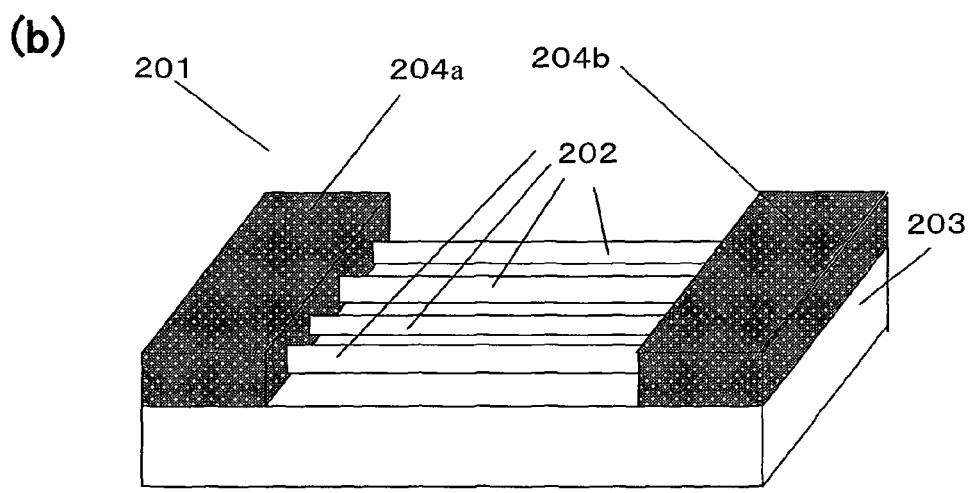

The nanowire light-emission device 201 shown in FIG. 7(*b*) includes a first electrode 204*a* and a second electrode 204*b* which are in contact with the hetero nanowires 202, and a substrate 203 supporting them. In the hetero nanowires 202, in order to form good electrical contacts, the first electrode 204*a* and the second electrode 204*b* are in contact with the nanowires 206 for contact purposes, thus forming electrical contacts.

The first electrode 204*a* and the second electrode 204*b* function as a positive electrode or a negative electrode. When a voltage is applied to each electrode, holes are injected from the positive electrode, and electrons are injected from the negative electrode, into the semiconductor particle-containing nanowires 205. These injected carriers undergo a recombination within the semiconductor particle-containing nanowires 205, whereby light emission occurs.

Hereinafter, a case will be described where the Ge particle-containing SiGe nanowire according to Embodiment 1 is used as the semiconductor particle-containing nanowire 205.

Figure 8:
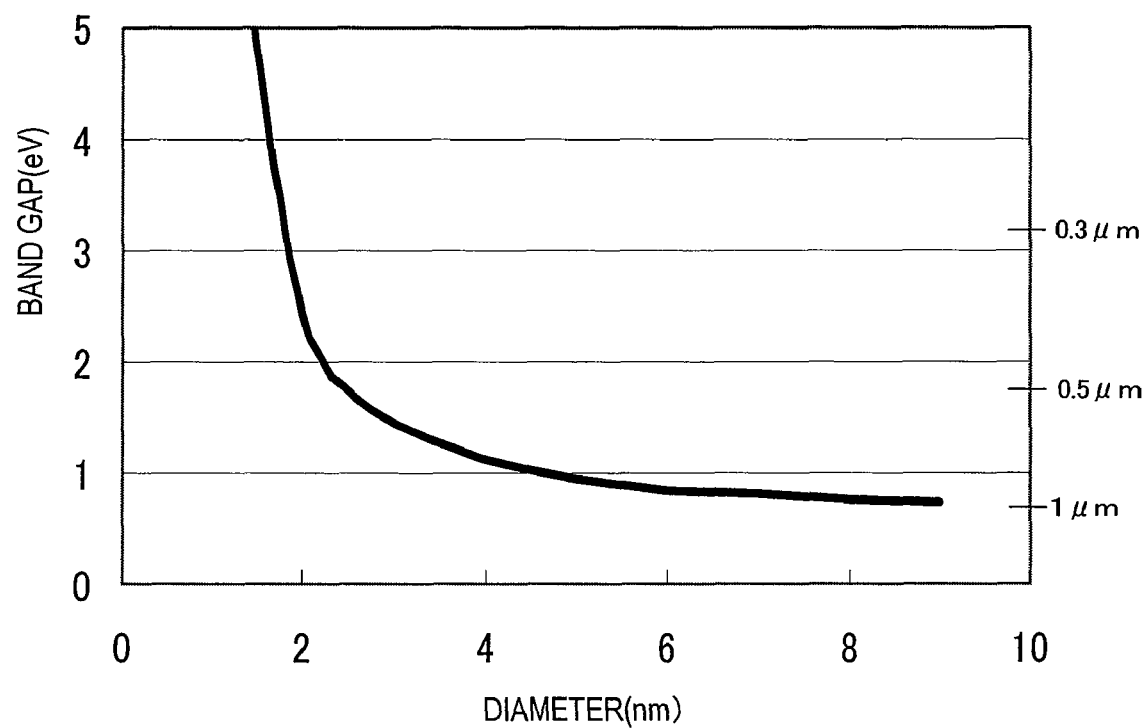
FIG. 8 A graph showing a relationship between the Ge particle size and the band gap.

In an indirect transition semiconductor, such as silicon or germanium in a bulk state, light emission hardly occurs. However, when particles of such semiconductors become small in particle size, a pseudo direct transition process becomes possible, thus enabling light emission. FIG. 8 is a graph showing a relationship between the Ge particle size and the band gap. As the particle size of Ge particles decreases, the band gap increases due to a quantum size effect, whereby light emission in the visible region becomes possible. Therefore, by controlling the particle size of Ge particles, the emission wavelength can be controlled. By allowing the particle size of Ge particles to have a distribution from about 2 nm to 5 nm, it becomes possible to increase the range of emission wavelength and even obtain white emission.

As the substrate 203 shown in FIG. 7(*b*), various substrates can be used, e.g., a substrate of plastic such as polyimide or aromatic ester, a glass substrate, or a sapphire substrate. As the material of the first electrode 204*a* and the second electrode 204*b*, it is possible to use a metal, e.g., titanium, gold, aluminum, or nickel, an electrically conductive polymer, polysilicon, or an alloy between a semiconductor material and a metal, e.g., titanium silicide.

In the nanowire light-emission device of the present embodiment, light emission is caused via the semiconductor particles having a different band gap, which are formed within the nanowires in a manner of self-organization. Since the particle size and density of the semiconductor particles can be controlled by the aforementioned method, unevenness in emission intensity and a sharp emission spectrum can be realized.

Next, a production method for the nanowires and nanowire light-emission device according to the present embodiment will be described.

First, a production method for the hetero nanowires 202 will be described. Although it is basically similar to the method described with respect to Embodiment 1, it differs from the method of Embodiment 1 in that a hetero nanowire structure is realized by switching the source gas in the middle of the nanowire growth.

Specifically, a silicon substrate which functions as a growth substrate is provided, and catalyst particles are formed on the silicon substrate. As the method for forming the catalyst particles, a method similar to that of Embodiment 1 can be used for the formation.

Next, the silicon substrate having the catalyst particles formed thereon is inserted in a chamber of a CVD apparatus or the like. Then, source gas is introduced into the chamber, which is kept at a predetermined pressure, and the silicon substrate is heated at a temperature that is lower than the temperature at which the source gas will decompose. As a result, on the silicon substrate, the elements composing the nanowires in the source gas which has been decomposed at the catalyst particle surface react with the catalyst particles, whereby an alloy between them is formed.

Next, $Si_2H_6$ gas is introduced as a source gas of silicon, for example. Through decomposition of the source gas, silicon, which is an element composing the nanowires, precipitates. The silicon which has precipitated congregates, whereby a crystalline semiconductor layer grows and Si nanowires are formed. These Si nanowires will function as nanowires for contact purposes. After the Si nanowires are grown to a desired length, a hetero growth of SiGe nanowires can be effected by, as the source gas, introducing $Si_2H_6$ gas and e.g. $GeH_4$ gas, which is a source of the germanium element. When growing the SiGe nanowires, the growth temperature may be changed from when growing the Si nanowires. Although Embodiment 1 illustrated only IV group materials as the nanowire material, other materials can also be used for the formation by changing the source material.

After growing the SiGe nanowires to a predetermined length, the source gas is again switched to that of silicon, and a hetero growth of Si nanowires is performed. Thus, hetero nanowires as shown in FIG. 7(*a*) can be obtained.

Except for using the aforementioned hetero nanowires, the nanowire light-emission device can be produced by known methods. Hereinafter, a production method for the nanowire light-emission device of the present embodiment will be described.

Figure 9:
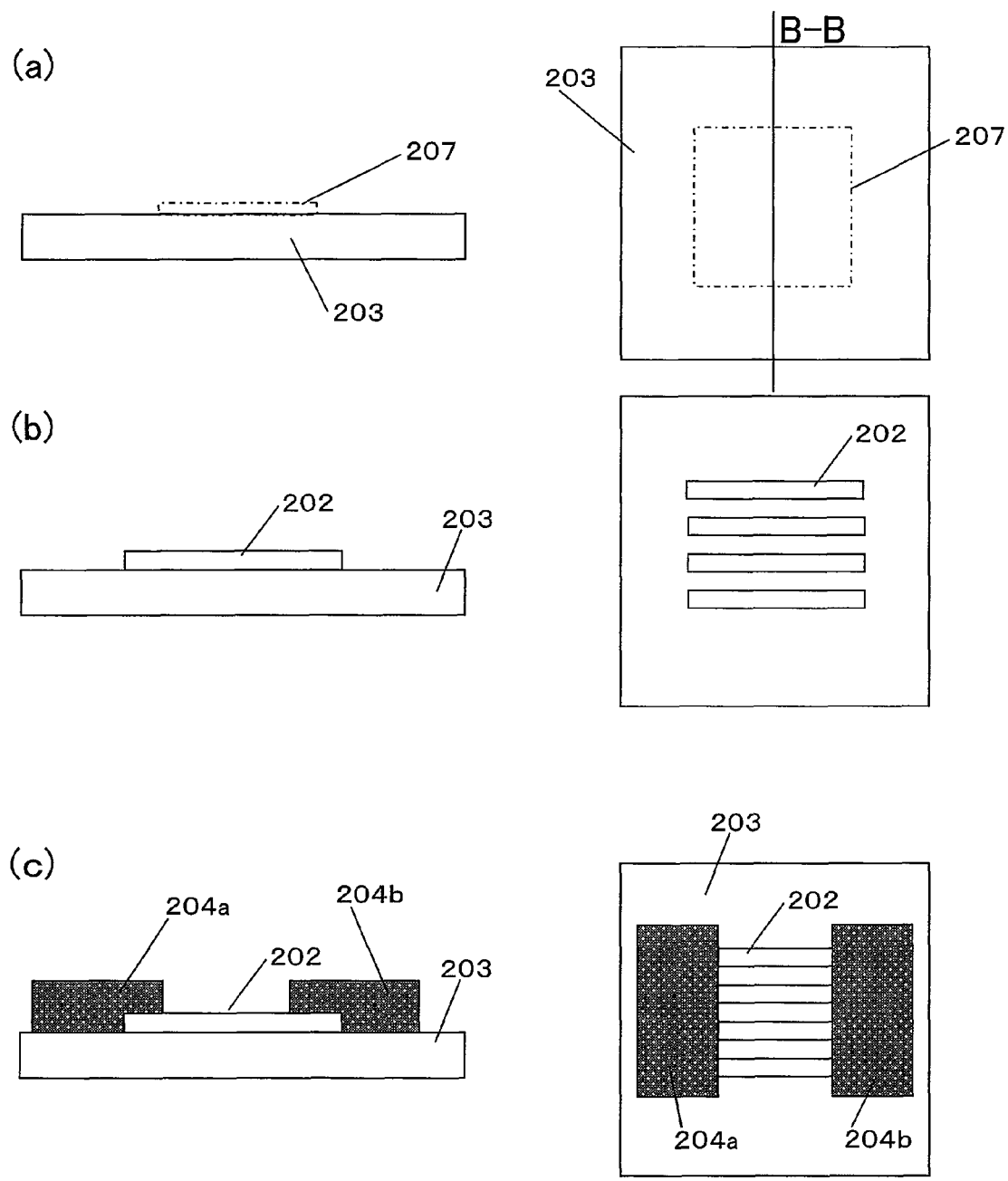
FIG. 9 (a) to (c) are step diagrams showing a production method for a nanowire light-emission device of Embodiment 2.

FIG. 9(*a*) to FIG. 9(*c*) are diagrams showing an example of a production method for the nanowire light-emission device of the present embodiment.

First, as shown in FIG. 9(*a*), a region 207 in which to dispose nanowires is defined on a principal face of the substrate 203. Specifically, a hydrophilic film is deposited in the region 207 to dispose nanowires, by using a known photolithography, for example.

Next, hetero nanowires 202 are disposed in the region 207 in which to dispose nanowires. Specifically, the hetero nanowires 202 are peeled off their growth substrate (not shown in FIG. 9), and are dispersed in a solution. As the method of peeling the hetero nanowires 202 off the growth substrate, a method of mechanically peeling them by irradiating the growth substrate with ultrasonic waves, or a method of thinly etching the surface of the growth substrate may be used, for example.

As the solvent to be used for the dispersion, an aqueous solution, an organic solvent, or a mixture of water and an organic solvent may be used. As an organic solvent, for example, alcohols such as ethanol, propanol, pentanol, hexanol, or ethylene glycol, esters such as ethylene glycol monomethyl ether, ketones such as methyl ethyl ketone, alkanes such as hexane or octane, or solvents such as tetrahydrofuran or chloroform may be suitably used. As a liquid mixture of water and an organic solvent, a liquid mixture of water and alcohol, a liquid mixture of water and tetrahydrofuran, or the like can be used.

Next, a mold having grooves in desire shapes on its surface is placed in close contact with the upper face of the substrate 203, and the aforementioned dispersion is allowed to flow in the grooves (flow technique). By using such a flow technique, it becomes possible to control the positions and shapes of the hetero nanowires 202 with the grooves in the mold, so that the nanowire directions can be aligned in the direction of the mold, with the liquid flow. Note that, by using known methods other than the flow technique, e.g. a transfer technique, it is also possible to place the hetero nanowires 202 in desired positions on the substrate 203.

Next, as shown in FIG. 9(c), a first electrode 204a and a gate second electrode 204b are formed on the principal face of the substrate 203. These electrodes can be formed by depositing a gate metal by using a known film formation apparatus based on sputtering technique, vapor deposition technique, or the like, and thereafter patterning the metal film by photolithography and etching technique, for example. As for other methods, they can also be formed by lift-off technique.

According to the present embodiment, after a plurality of nanowires to function as a light-emitting region are grown on a growth substrate, they can be disposed on a substrate which is made of any other arbitrary material, through an application process. Therefore, it is even possible to realize a light-emission device which is disposed on a plastic substrate which has a low thermal resistance.

Embodiment 3

Next, with reference to FIG. 10 and FIG. 11, a third embodiment of the nanowire according to the present invention will be described. In the nanowire of the present embodiment, a plurality of hetero structures are present within one nanowire, each hetero structure being constituted by a Ge particle-containing nanowire described in Embodiment 1 and a nanowire not containing any Ge particles. Such a nanowire will be referred to as a "multi Ge particle-containing nanowire".

Figure 10:
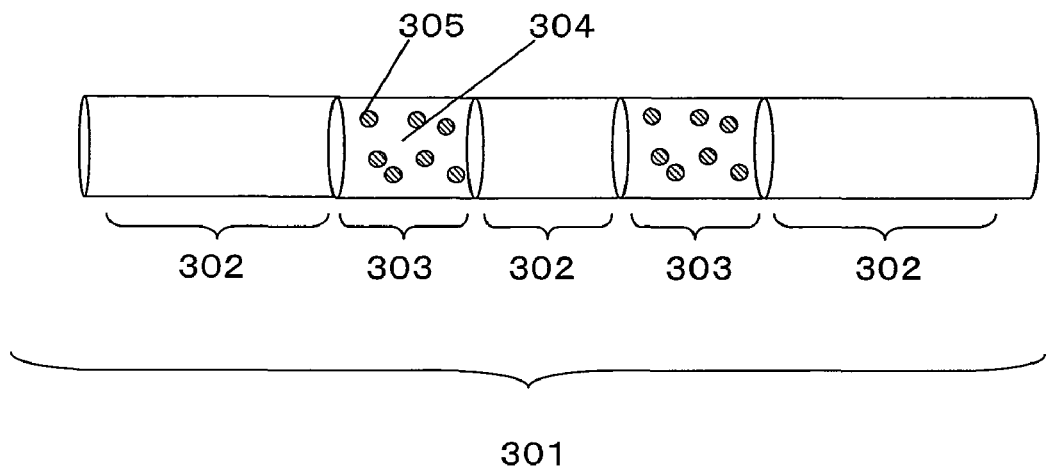
FIG. 10 A diagram showing the structure of a nanowire of Embodiment 3.
Figure 11:
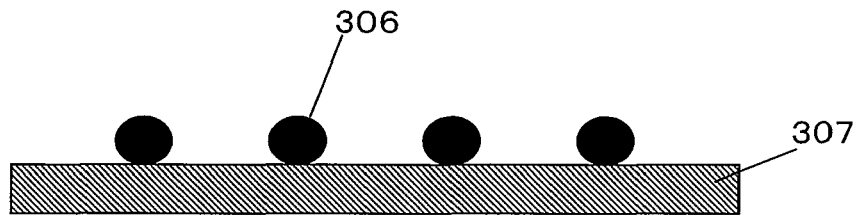
FIG. 11 (a) to (d) are step diagrams showing a production method for a nanowire of Embodiment 3.
Figure 11:
Figure 11:
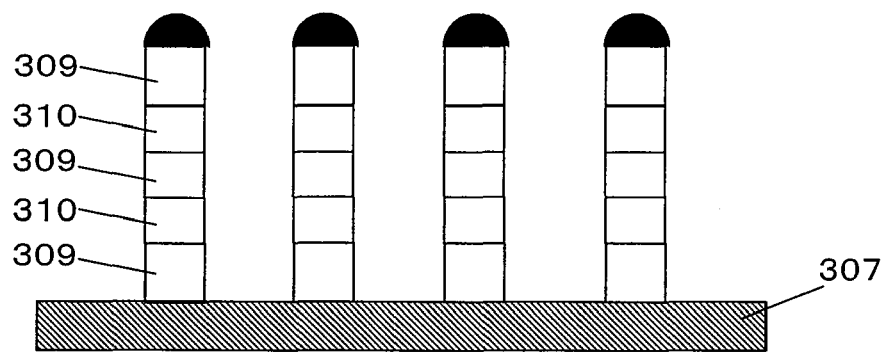
Figure 11:
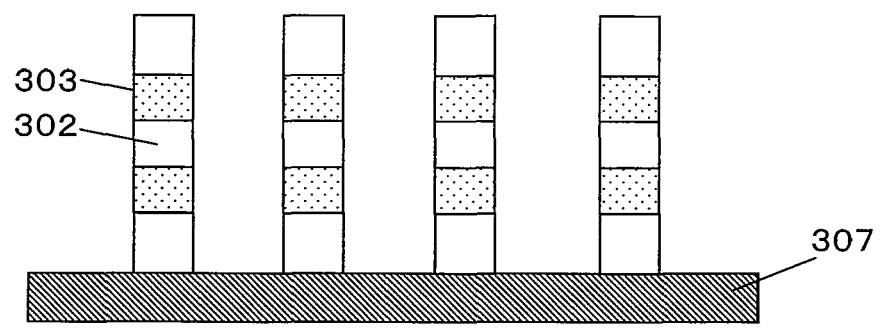

FIG. 10 is a cross-sectional view showing the structure of a multi Ge particle-containing nanowire 301 according to the present embodiment. FIG. 11 is a diagram showing a production method for the nanowire of the present embodiment.

The multi Ge particle-containing nanowire 301 shown in FIG. 10 includes a plurality of regions 303 where Ge particles exist and regions 302 where Ge particles are absent. A feature of the present embodiment is that the regions 303 where Ge particles exist are composed of nanowires of Embodiment 1, and that there are a plurality of hetero structures with the regions 302 lacking Ge particles. The regions where Ge particles are absent are made of a semiconductor material such as Si, Ge, GaAs, or GaN, for example.

In the present embodiment, the axial-direction sizes of each region where Ge particles exist and each region where Ge particles are absent can be controlled on the nanometer order during the growth of the nanowire. Moreover, as has been described earlier, in the Ge particle-containing nanowire, the particle size and density of Ge particles can be varied by adjusting the Ge mole fraction ratio in the nanowire. Such a multi GeSi nanowire, in which fine Ge particles with sizes of several nm are contained in a manner of self-organization, is expected to possess a broad applicability to electronic devices, e.g., transistors, light-emission devices, photodetection devices, and memories.

Next, with reference to FIGS. 11(a) to (d), an example of a production method for the nanowire of the present embodiment will be described. Herein, a nanowire whose region where Ge particles are absent is composed of silicon will be described.

First, as shown in FIG. 11(a), a substrate 307 which functions as a growth substrate is provided, and catalyst particles 308 are formed on the substrate 307. As the method of formation, the method described above in Embodiment 1 may be used.

Next, the substrate 307 having the catalyst particles 308 formed thereon is inserted in a chamber of a CVD apparatus or the like. Then, as shown in FIG. 11(b), source gas 308 is introduced into the chamber, which is kept at a predetermined pressure, and the substrate 307 is heated at a temperature that is lower than the temperature at which the source gas 308 will decompose. As a result, the elements composing the nanowires in the source gas 308 which has been decomposed at the surface of the catalyst particles 306 react with the catalyst particles 306, whereby an alloy between them is formed.

Next, as shown in FIG. 11(c), growth is conducted while switching the source gas 308, whereby hetero structures in which the Si nanowires 309 and the SiGe nanowires 310 are alternately jointed can be formed.

Next, as shown in FIG. 11(d), after the catalyst particles 306 are removed, the aforementioned nanowires are subjected to a thermal oxidation treatment, whereby multi Ge particle-containing nanowires can be formed. The condition of the thermal oxidation treatment may be set according to the particle size and density of the Ge particles, as has been described in Embodiment 1.

Next, with reference to FIG. 12, an example of a light-emission device in which the nanowires of the present embodiment are used will be described.

Figure 12:
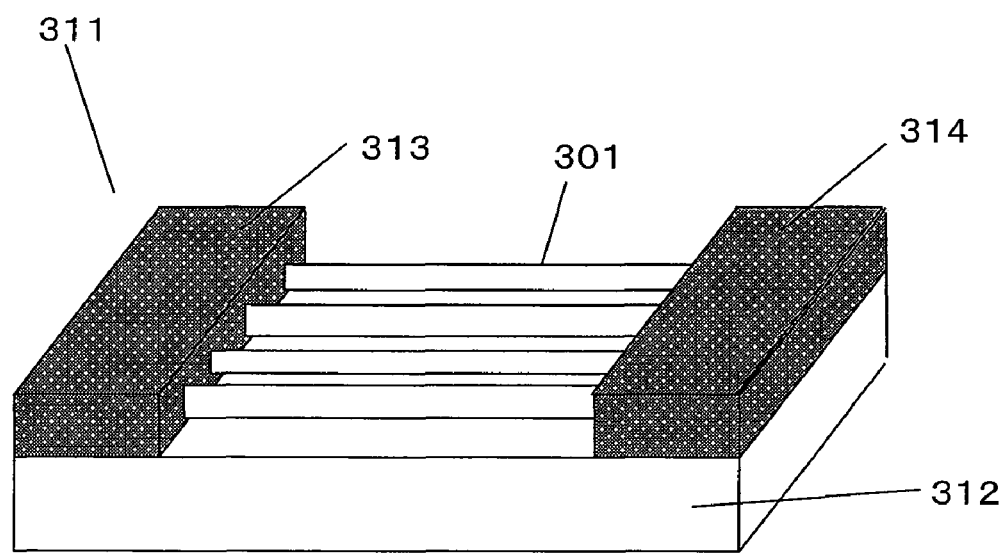
FIG. 12 A perspective view of a nanowire light-emission device of Embodiment 3.

In a nanowire light-emission device 311 shown in FIG. 12, the multi Ge particle-containing hetero nanowires 301 of the present embodiment are used as a light-emitting region. The nanowire light-emission device has a similar structure to the structure of the nanowire light-emission device of Embodiment 3.

This nanowire light-emission device can be produced with a production method similar to that for the nanowire light-emission device of Embodiment 2.

In the light-emission device of the present embodiment, a more strict control of the density and particle size of the Ge particles is possible over the nanowire of Embodiment 2, whereby emission intensity unevenness and a sharp emission spectrum can be obtained. Furthermore, since Ge particles of different particle sizes can be formed in one nanowire, it also becomes possible to vary the emission wavelength by controlling the applied voltage or other manipulations.

Embodiment 4

Figure 13:
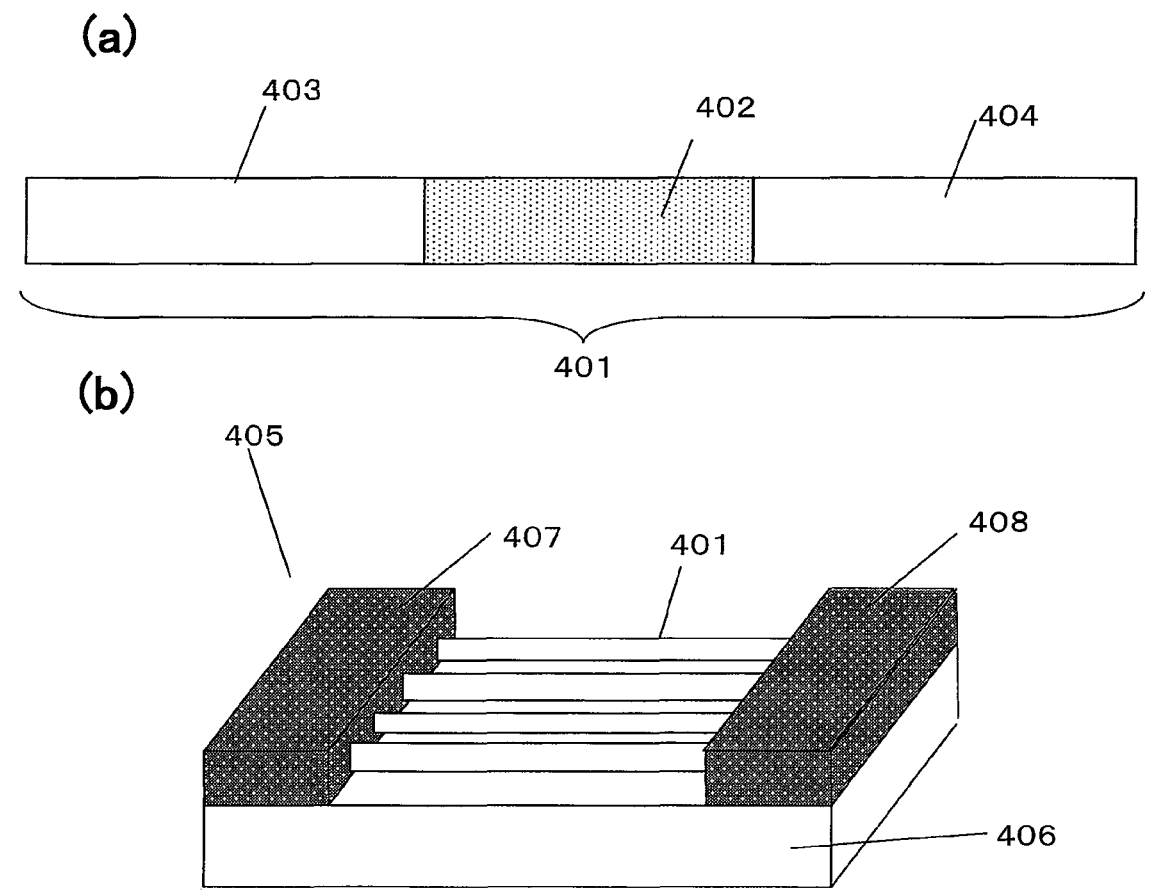
FIG. 13 (a) is a cross-sectional view of a nanowire of Embodiment 4; and (b) is a perspective view of a nanowire photodetection device of Embodiment 4.
Figure 14:
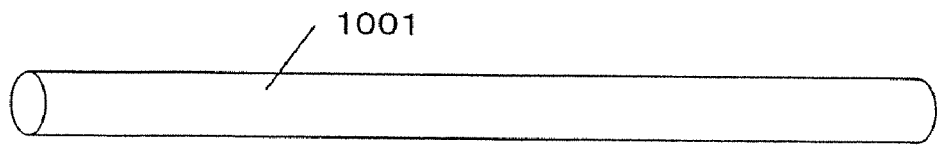
FIG. 14 (a) to (c) are each a perspective view of a conventional nanowire.
Figure 14:
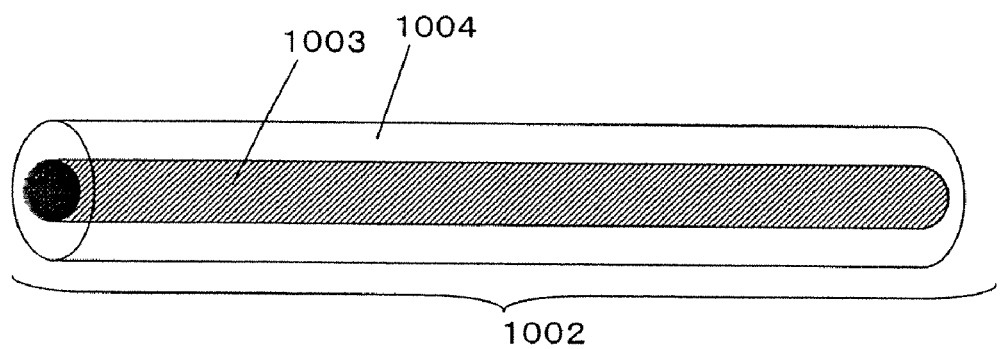
Figure 14:
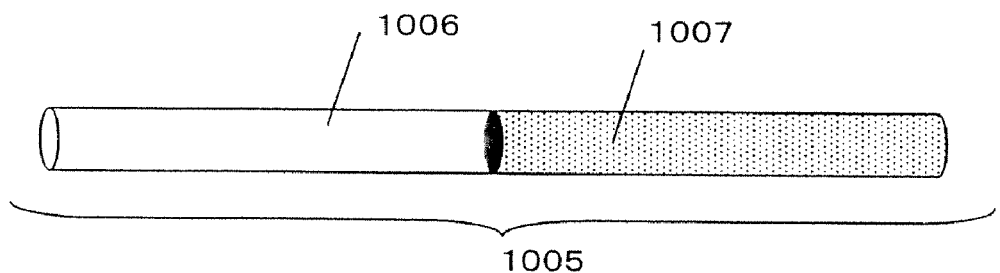

Hereinafter, with reference to FIG. 13, an embodiment of a photodetection device in which nanowires according to the present invention are used (hereinafter referred to as a "nanowire photodetection device") will be described. The nanowires to be used in the present embodiment are nanowires obtained by doping the Si nanowire portions of the hetero nanowires of Embodiment 2 with impurities (hereinafter referred to as a "Ge particle-containing doped hetero nanowire").

FIG. 13(a) is a structural diagram showing a Ge particle-containing doped hetero nanowire according to the present embodiment. FIG. 13(b) is a perspective view showing a nanowire light-emission device 405 in which Ge particle-containing doped hetero nanowires 401 are used.

The Ge particle-containing doped hetero nanowire 401 shown in FIG. 13(a) has a hetero structure of the p-i-n conductivity types, such that a p-Si nanowire 403 and an n-Si nanowire 404 are connected to both ends of a Ge particle-containing nanowire 402. The p-Si nanowire 403 and the n-Si nanowire 404 are doped with about $1 \times 10^{18}$ atoms/cm$^{-3}$ to $1 \times 10^{20}$ atoms/cm$^{-3}$ of a III group element such as boron or a V group element such as phosphorus or arsenic.

The nanowire photodetection device 405 shown in FIG. 13(b) includes a first electrode 407 and a second electrode 408 which are in contact with the Ge particle-containing doped hetero nanowires 401, and a substrate 406 supporting them. The first electrode 407 and the second electrode 408 are respectively in contact with the p-Si nanowire 403 and the n-Si nanowire 404, thus forming electrical contacts.

When a P-i-N structure diode is irradiated with light while a reverse bias voltage is being applied thereto, electron-hole pairs occur due to light absorption. The carriers (electrons and holes) which have occurred due to light absorption migrate toward the corresponding electrodes, and are taken out as an electric current to an external circuit. By detecting this electric current, it becomes possible to detect the intensity of the irradiation light.

As the substrate 403, various substrates can be used, e.g., a substrate of plastic such as polyimide or aromatic ester, a glass substrate, or a sapphire substrate. As the material of the first electrode 404a and the second electrode 404b, it is possible to use a metal, e.g., titanium, gold, aluminum, or nickel, an electrically conductive polymer, polysilicon, or an alloy between a semiconductor material and a metal, e.g., titanium silicide.

The nanowire photodetection device of the present embodiment can be produced by a production method similar to the production method for the nanowire light-emission device of Embodiment 2.

According to the present embodiment, a photodetection device which covers a broad wavelength region from the visible region to the near-infrared region can be formed on an arbitrary substrate. Moreover, the length and diameter of the nanowires can be precisely controlled in a broad range on the order of nanometers to microns, and therefore the design freedom of the device is increased.

By subjecting an SiGeC nanowire to a heat treatment, it becomes possible to form SiC nanoparticles in the nanowire. Moreover, after growing a nanowire which is made of a compound semiconductor of N types of elements (N>2), the nanowire is subjected to a heat treatment at a temperature which is higher than the growth temperature thereof, whereby nanoparticles can be formed. Among the elements composing the compound semiconductor, if there exists a combination of elements which are capable of composing a stable structure (compound species), it is possible, through a heat treatment, to form nanoparticles that are made of a combination of such elements. For example, after a GaMnAs nanowire is grown at a relatively low temperature (e.g. 300° C. or less), a heat treatment of about 600° C. may be conducted, for example, whereby MnAs nanoparticles of the hexagonal system are formed in GaAs. Since such nanowires exhibit a tunnel magnetoresistance (TMR) effect, they are expected to possess applicability to devices such as magnetoresistive random access memories (MRAMs).

INDUSTRIAL APPLICABILITY

A nanowire according to the present invention can be produced through a simple production process, and is applicable to electronic devices such as transistors and light-emission devices, microdevices, and the like.

The invention claimed is:

1. A nanowire comprising:
    a nanowire body made of a first semiconductor material which contains a plurality of elements; and
    a plurality of nanoparticles made of a second semiconductor material which contains at least one of the plurality of elements and is different from the first semiconductor material, the plurality of nanoparticles being located at least one of an interior and a surface of the nanowire body.

2. The nanowire of claim 1, wherein the first semiconductor material and the second semiconductor material have different band gaps.

3. The nanowire of claim 1, wherein the plurality of nanoparticles are single-crystalline or polycrystalline.

4. The nanowire of claim 1 having at least one first region in which the plurality of nanoparticles are located at least one of the interior and the surface of the nanowire body and at least one second region in which the plurality of nanoparticles are not located at the interior or the surface of the nanowire body.

5. The nanowire of claim 4, wherein the first region and the second region are composed of different semiconductor materials.

6. The nanowire of claim 1, wherein the first semiconductor material is made of at least two elements selected from the group consisting of silicon, germanium, and carbon.

7. An electronic device comprising the nanowire of claim 1.

8. A light-emission device comprising:
    at least one nanowire; and
    a first electrode and a second electrode which are connected to the nanowire, wherein, the nanowire includes
    a nanowire body made of a first semiconductor material which contains a plurality of elements, and
    a plurality of nanoparticles made of a second semiconductor material which contains at least one of the plurality of elements and is different from the first semiconductor material, the plurality of nanoparticles being located in at least a portion of an interior and a surface of the nanowire body; and
    when a voltage is applied to the first electrode and the second electrode, at least a portion of the plurality of nanoparticles emits light.

9. The light-emission device of claim 8, wherein, in the nanowire, the plurality of nanoparticles are located in the interior of the nanowire body and covered by the first semiconductor material.

10. A photodetection device comprising:
    at least one nanowire; and
    a first electrode and a second electrode connected to the nanowire, wherein, the nanowire includes
    a nanowire body made of a first semiconductor material which contains a plurality of elements, and
    a plurality of nanoparticles made of a second semiconductor material which contains at least one of the plurality of elements and is different from the first semiconductor material, the plurality of nanoparticles being located in at least a portion of an interior and a surface of the nanowire body; and
    when light is incident on the plurality of nanoparticles, an electric current occurs between the first electrode and the second electrode.

11. The light-emission device of claim 10, wherein the plurality of nanoparticles are present in the light-receiving region of the nanowire.

12. A production method for a nanowire, comprising:
   step (A) of providing a substrate having catalyst metal particles disposed on a surface;
   step (B) of growing on the substrate a nanowire body being made of a first semiconductor material which contains a plurality of elements; and
   step (C) of forming, in at least a portion of a surface and an interior of the nanowire body, a plurality of nanoparticles being made of a second semiconductor material which contains at least one of the plurality of elements, wherein, step (C) includes:
   step (c1) of allowing the plurality of nanoparticles to precipitate on the surface of the nanowire body; and
   step (c2) of allowing at least a portion of the plurality of nanoparticles to move to the interior of the nanowire body.

13. The production method of the nanowire of claim 12, wherein step (c1) allows the plurality of nanoparticles to precipitate on the surface of the nanowire body by subjecting a surface of the first semiconductor material to a thermal oxidation.

14. The production method for a nanowire of claim 12, wherein step (c2) allows the plurality of nanoparticles to move by subjecting the nanowire body to a heat treatment in an inert gas ambient.

* * * * *